United States Patent
Park et al.

(10) Patent No.: US 8,045,387 B2
(45) Date of Patent: Oct. 25, 2011

(54) NONVOLATILE MEMORY DEVICE AND PROGRAM METHOD WITH IMPROVED PASS VOLTAGE WINDOW

(75) Inventors: Ki-Tae Park, Seongnam-si (KR);
Yeong-Taek Lee, Seoul (KR);
Soon-Wook Hwang, Suwon-si (KR);
Young-Wook Jeong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 204 days.

(21) Appl. No.: 12/509,612

(22) Filed: Jul. 27, 2009

(65) Prior Publication Data

US 2010/0067305 A1 Mar. 18, 2010

(30) Foreign Application Priority Data

Sep. 18, 2008 (KR) .................. 10-2008-0091695

(51) Int. Cl.
*G11C 11/34* (2006.01)
*G11C 16/04* (2006.01)
(52) U.S. Cl. ......... 365/185.19; 365/185.17; 365/185.18; 365/185.28
(58) Field of Classification Search ............. 365/185.17, 365/185.19, 185.28
See application file for complete search history.

(56) References Cited

U.S. PATENT DOCUMENTS

| 7,170,793 | B2 | 1/2007 | Guterman | |
|---|---|---|---|---|
| 2007/0047313 | A1 | 3/2007 | Hosono | |
| 2008/0049494 | A1 | 2/2008 | Aritome | |
| 2009/0238007 | A1* | 9/2009 | Jang | 365/185.19 |
| 2009/0257280 | A1* | 10/2009 | Oh et al. | 365/185.19 |
| 2009/0257281 | A1* | 10/2009 | Lee | 365/185.19 |
| 2010/0020600 | A1* | 1/2010 | Lee | 365/185.03 |

FOREIGN PATENT DOCUMENTS

| KR | 1020060066958 | A | | 6/2006 |
|---|---|---|---|---|
| KR | 2006108324 | A | * | 10/2006 |
| KR | 1020060107689 | A | | 10/2006 |
| KR | 1020060115996 | A | | 11/2006 |

* cited by examiner

*Primary Examiner* — Ly D Pham
(74) *Attorney, Agent, or Firm* — Volentine & Whitt, PLLC

(57) ABSTRACT

A flash memory and programming method are disclosed. The flash memory includes a memory cell array having memory cells arranged in a plurality of word lines including a selected word line and a plurality of non-selected word lines and a plurality of bit lines, a high voltage generator generating a program voltage applied to the selected word line, and a pass voltage applied to at least one of the non-selected word lines adjacent to the selected word line, and control logic controlling the generation of the program voltage, such that the program voltage is incrementally increased during a program operation, and generation of the pass voltage, such that the program voltage is incrementally increased.

15 Claims, 22 Drawing Sheets

NONVOLATILE MEMORY DEVICE AND PROGRAM METHOD WITH IMPROVED PASS VOLTAGE WINDOW

CROSS-REFERENCE TO RELATED APPLICATION

This U.S. non-provisional patent application claims priority under 35 U.S.C. §119 to Korean Patent Application No. 10-2008-0091695 filed Sep. 18, 2008, the subject matter of which is hereby incorporated by reference.

BACKGROUND OF THE INVENTION

The present disclosure relates to memory devices and programming methods for memory devices. More particularly, the disclosure relates to memory device programming methods that control the levels of a pass voltage and a local voltage in relation to a program voltage that increases during a program operation.

Over the past several decades, flash memory has become a commercially important form of nonvolatile memory. Like all nonvolatile memory, flash memory is able to retain stored data in the absence of applied power. Yet, flash memory is capable of being very densely integrated on a stored bit per unit area basis. Increasing integration density is enabled by shrinking design rules (i.e., constituent components are designed with smaller sizes and less inter-component spacing). Unfortunately, shrinking design rules lead to certain fabrication and performance problems with the resulting memory devices.

For example, design rules for contemporary flash memory continue to shrink, it becomes increasingly difficult to secure and maintain a so-called pass voltage window. A "pass voltage window" is an important performance consideration in flash memory and is critical to successful program operations.

During a program operation, a program voltage (Vpgm) is applied to a selected word line, and a pass voltage (Vpass) is applied to a non-selected word line. Under these conditions, a program voltage disturb may occur due to a low pass voltage. A program voltage disturb is a well known phenomenon in flash memory and arises when one or more program-inhibited memory cells within a plurality of memory cells connected to a selected word line (i.e., a word line receiving the program voltage (Vpgm)) are nonetheless programmed by the applied program voltage. This inadvertent programming of what should have been program-inhibited memory cells results in a program operation failure.

A pass voltage disturb is a similar type of programming failure. It arises, however, from a high pass voltage. That is, a high pass voltage is applied to memory cells within a plurality of memory cells connected to a memory cell string resulting in the inadvertent programming of memory cells and a program operation failure.

Thus, a pass window voltage may be understood as a voltage range bounded on one end by a pass voltage level so low that a program voltage disturb occurs and on the other end by a pass voltage level so high that a pass voltage disturb occurs. Clearly, the overall reliability of the program operation is enhanced by obtaining the widest possible pass voltage window.

SUMMARY OF THE INVENTION

Embodiments of the invention provide a memory device and program method capable of expanding a pass voltage window.

Embodiments of the invention provide a memory device including; a memory cell array comprising a plurality of memory cells arranged in relation to a plurality of word lines including a selected word line and a plurality of non-selected word lines, and a plurality of bit lines, a high voltage generator configured to generate a program voltage applied to the selected word line, and a pass voltage applied to at least one of the non-selected word lines adjacent to the selected word line, and control logic configured to control the generation of the program voltage, such that the program voltage is incrementally increased during a program operation, and further configured to control the generation of the pass voltage, such that the program voltage is incrementally increased.

The generation of the program voltage may be controlled in relation to a defined Incremental Step Pulse Programming (ISPP).

The pass voltage may be incrementally increased in response to the program voltage.

The high voltage generator may be further configured to generate a local voltage applied during programming in a local self-boosting scheme to at least one of the non-selected word lines.

The generation of the local voltage may be controlled to decrease the local voltage in response to the program voltage.

The memory cell array may also include at least one memory cell string, and the program voltage may be applied to one memory cell in the memory cell string, a first pass voltage may be applied to an upper word line with respect to the one memory cell, and a second pass voltage may be applied to a lower word line with respect to the one memory cell.

The second pass voltage may be greater than the first pass voltage to prevent charge sharing between memory cells.

The control logic may be further configured to divide the upper word line and the lower word line into a plurality of groups, and selectively apply the pass voltage and the local voltage to the plurality of groups.

The control logic may be further configured to apply the pass voltage and the local voltage to respective memory cells in the memory cell string.

Embodiments of the invention also provide a program method for a memory device including a memory cell array comprising a plurality of memory cells arranged in relation to a plurality of word lines including a selected word line and a plurality of non-selected word lines, and a plurality of bit lines, a high voltage generator configured to generate a program voltage applied to the selected word line and a pass voltage applied to at least one of the non-selected word lines adjacent to the selected word line, and control logic configured to control operation of the memory cell array and the high voltage generator. The program method comprises; generating the program voltage to be incrementally increasing, and generating the pass voltage in response to the program voltage.

Embodiments of the invention also provide a computational system comprising a central processing unit (CPU) and a memory controller connected via a system bus, the memory controller being connected to and controlling the operation of a memory device, wherein the memory device comprises; a memory cell array comprising a plurality of memory cells arranged in relation to a plurality of word lines including a selected word line and a plurality of non-selected word lines, and a plurality of bit lines, a high voltage generator configured to generate a program voltage applied to the selected word line, and a pass voltage applied to at least one of the non-selected word lines adjacent to the selected word line, and control logic configured to control the generation of the program voltage, such that the program voltage is incrementally increased during a program operation, and further configured to control the generation of the pass voltage, such that the program voltage is incrementally increased.

BRIEF DESCRIPTION OF THE DRAWINGS

The accompanying drawings are included to provide a further understanding of certain embodiments of the invention. In the drawings.

DESCRIPTION OF EMBODIMENTS

Embodiments of the invention will be described below in some additional detail with reference to the accompanying drawings. The present invention may, however, be embodied in different forms and should not be construed as being limited to only the illustrated embodiments. Rather, these embodiments are presented as teaching examples.

According to certain embodiments of the invention, during a program operation, a pass voltage and a local voltage are controlled in response to a program voltage which increases according to a defined Incremental Step Pulse Programming (ISPP). As a result of this control method within a nonvolatile memory programming operation, the size of a pass voltage window may be expanded.

Figure (FIG.) 1 is a block diagram illustrating a memory system according to an exemplary embodiment of the present invention.

Figure 1:
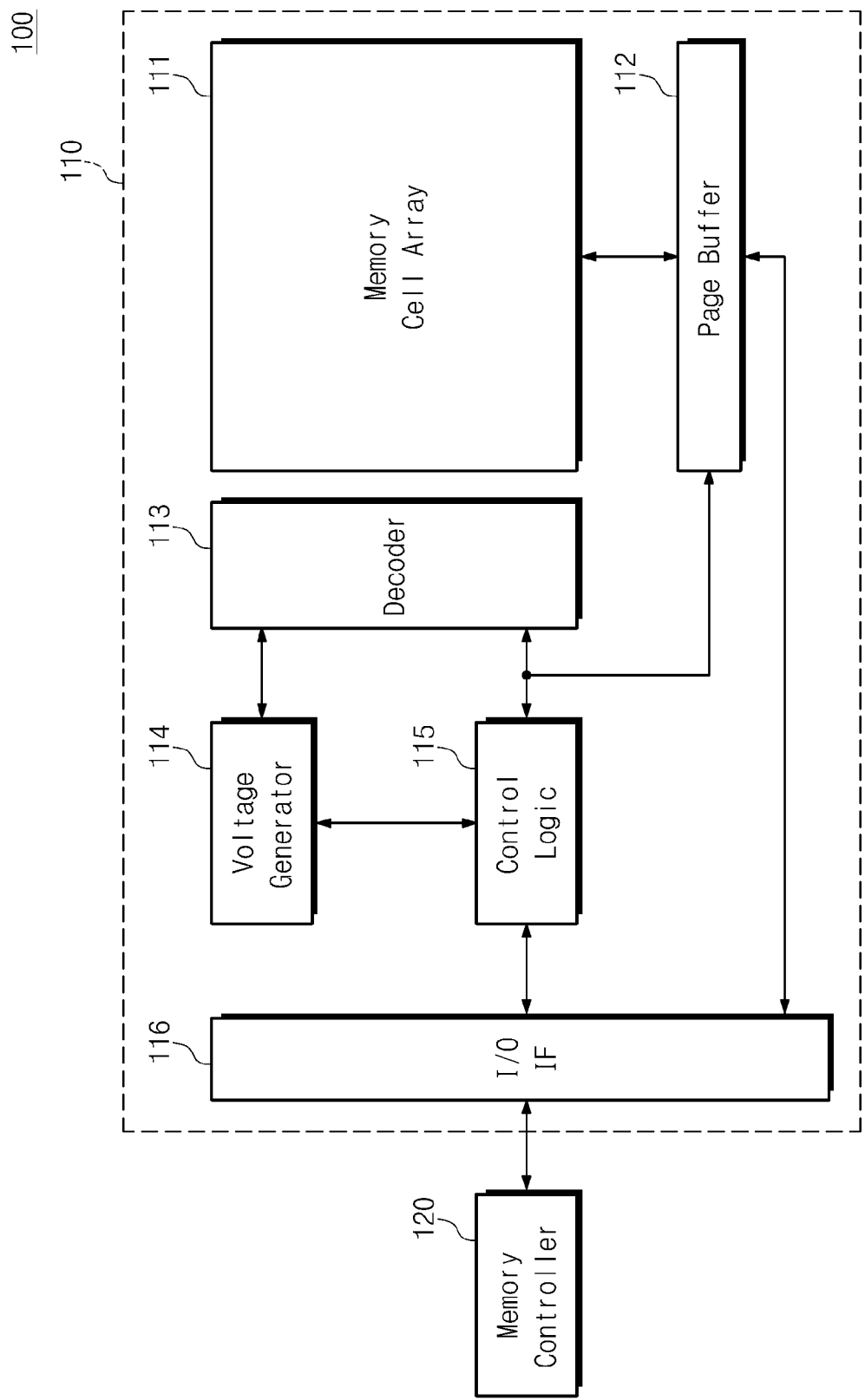
FIG. 1 is a block diagram illustrating a memory system according to an embodiment of the present invention.

Referring to FIG. 1, a memory system 100 according to an embodiment of the present invention generally comprises a memory device 110 and a memory controller (or a flash controller) 120. In certain embodiments of the invention, the memory device 110 is a flash memory device. Alternatively, the memory device 110 may be a Phase-change Random Access Memory (PRAM), a Magnetoresistive Random Access Memory (MRAM), or a Resistive Random Access Memory (RRAM).

The memory device 110 comprises a memory cell array 111 of nonvolatile memory cells adapted to store M-bit data, where M is a positive integer. The memory cell array 111 is typically divided into a plurality of regions. These regions can include a spare region and a data region generally intended to store data. Each of the regions of the memory cell array 111 may be further divided into a plurality of memory blocks. Numerous memory block configurations are conventionally understood and will not be further described.

The memory device 110 further comprises a page buffer 112, a decoder 113, a voltage generator 114, a control logic 115, and an input/output interface (I/O IF) 116. The page buffer 112 retrieves "read data" from the memory cell array 111 and programs "write data" to the memory cell array 111 under the control of the control logic 115.

The decoder 113 is also controlled by the control logic 115. Specifically, the decoder 113 selects a memory block from the plurality of memory blocks in memory cell array 111 and selects the word line within the selected memory block under the control of the control logic 115.

The selected word line is driven with a word line voltage provided by the voltage generator 114. The voltage generator 114 is controlled by the control logic 115 and generates a number of word line voltage (e.g., a read voltage, a program voltage, a pass voltage, a local voltage and a verification voltage) to be applied to the memory cell array 111.

In addition to the foregoing, the control logic 115 controls the overall, internal operation of the memory device 110.

The memory controller 120 dictates the operations performed by the memory device 110 in response to requests received from an external device (e.g., a host—not shown). As is conventionally understood, the memory controller 120 may include an Error Check and Correct (ECC) memory, a buffer memory, and a processing unit such as a central processing unit (CPU) or microprocessor.

The memory device 110 according to certain embodiments of the invention increases the pass voltage incrementally and decreases a local voltage incrementally in response to the program voltage being gradually increased during a program operation according to a defined ISPP. In this manner, the memory device 110 is able to expand the resulting pass voltage window.

In contrast, a fixed local program voltage is conventionally applied to a memory cell array regardless of the operational state (i.e., program or erase states) of the memory device and the resulting back data pattern for its constituent memory cells.

Figure 2:
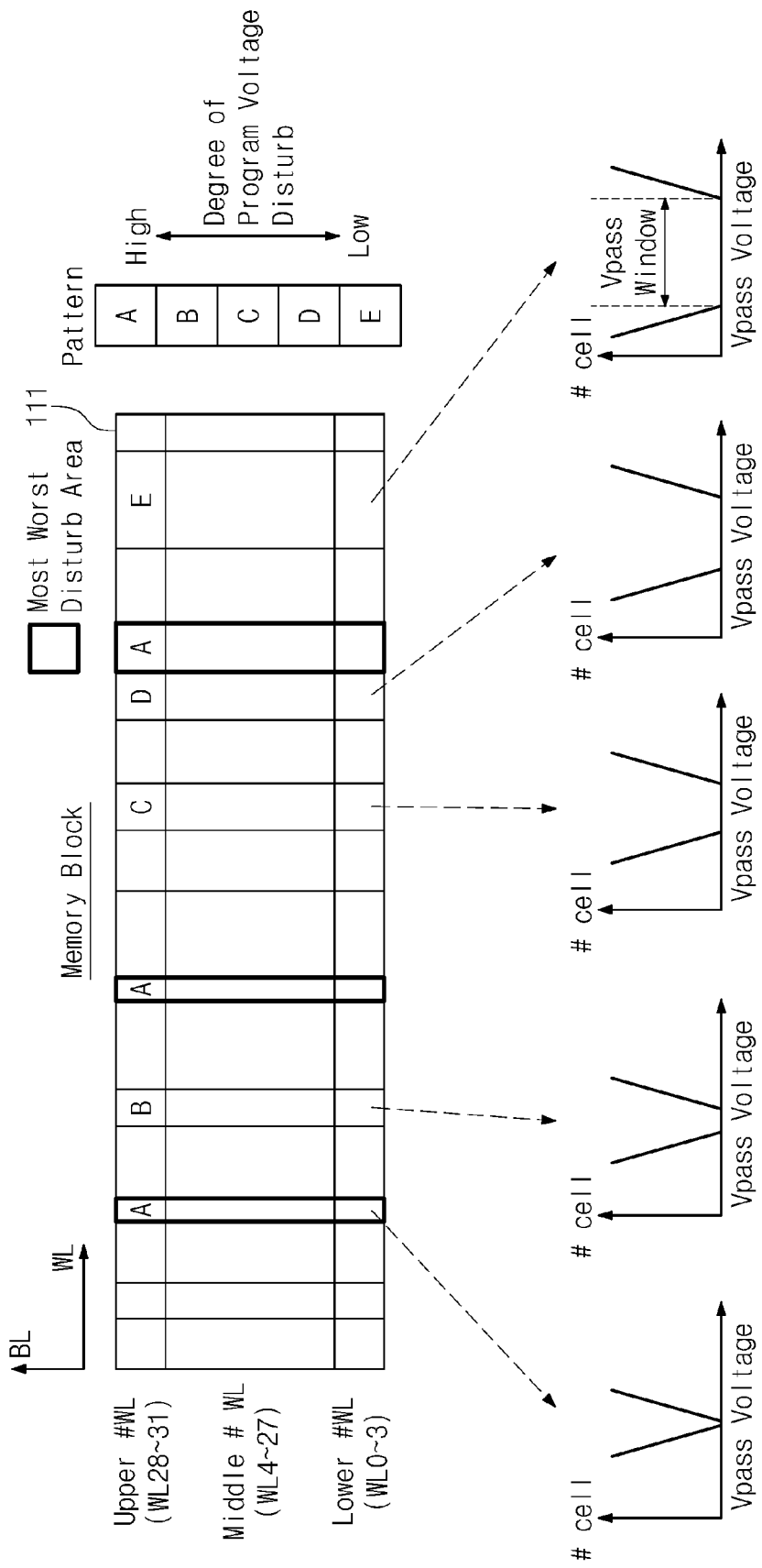
FIG. 2 is a diagram illustrating the back data pattern for a memory cell array in FIG. 1 and a relevant pass voltage window.

FIG. 2 is a diagram illustrating an exemplary back data pattern for the memory cell array of FIG. 1 and a corresponding pass voltage window.

Referring to FIGS. 1 and 2, the pass voltage window is modified in view of the current memory device operating state (i.e., a program state or an erase state) and the resulting back data pattern for memory cells in the memory cell array 111. That is, the size of the pass voltage window may be modified according to whether the memory cells of the memory cell array 111 are being programmed or erased. The modification of the pass voltage window in relation to a current operating state of the memory device 100 and the resulting program states for memory cells will be described in some additional detail with reference to FIGS. 4 through 7.

According to the illustrated embodiment of FIG. 2, the program states or erased states of certain memory cells is shown in five states. The memory cell states include an A state, a B state, a C state, a D state and an E state—as selected description examples. The program voltage disturb for memory cells in the A state is highest, and the program voltage disturb for memory cells in the E state is lowest. Accordingly, the pass voltage window for the memory cells in the A state is the narrowest, and the pass voltage window for the memory cells in the E state is the widest.

Figure 3:
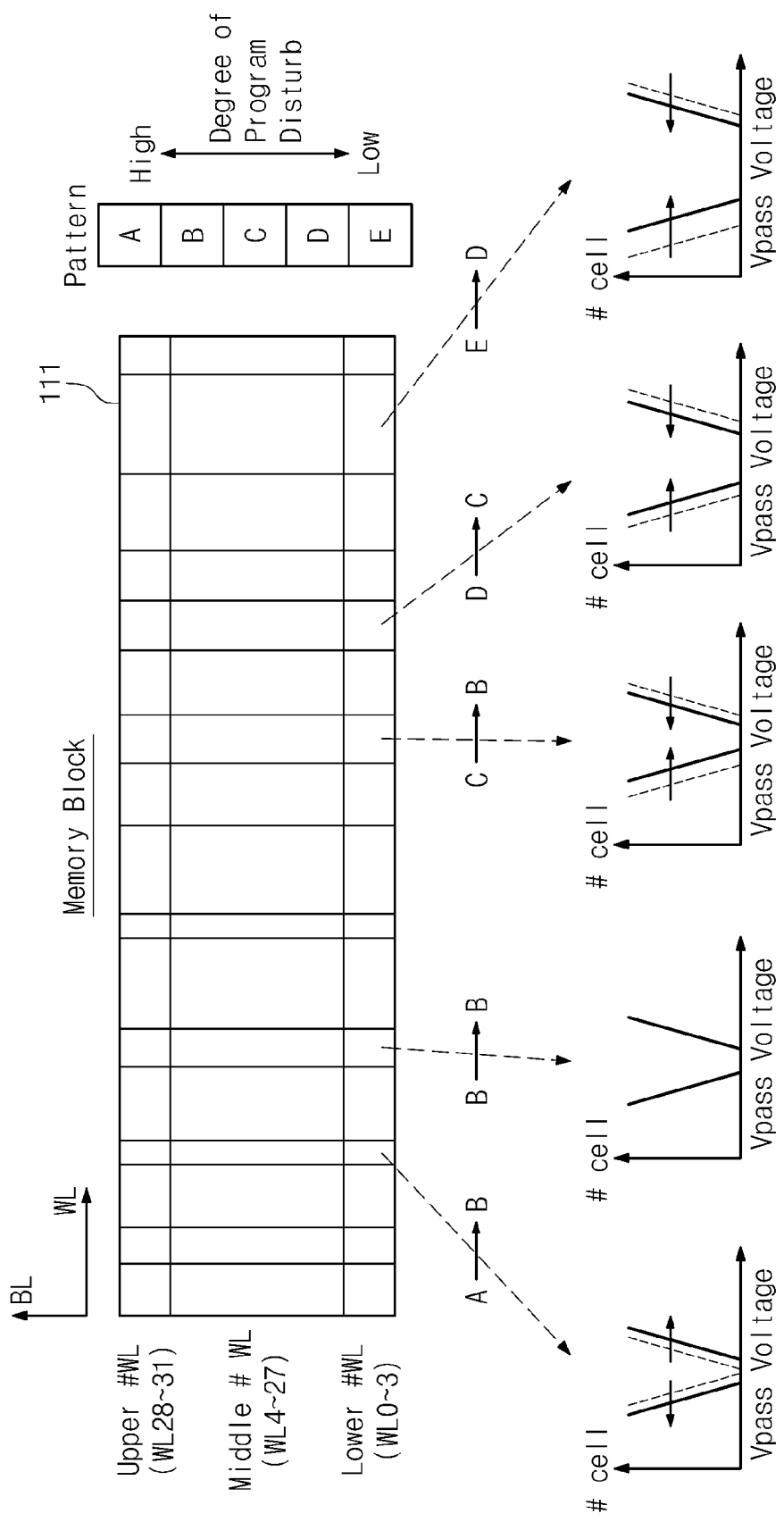
FIG. 3 is a diagram illustrating the equalization of the pass voltage window based on the back data pattern of the memory cell array in FIG. 2.

FIG. 3 is a diagram illustrating a process of equalization for the pass voltage window based on the back data pattern of the memory cells in the memory cell array of FIG. 2.

Referring to FIG. 3, a memory cell in the A state has the worst back data pattern, and a memory cell in the E state has the best or an optimal back data pattern. The pass voltage window may be set during the equalization process based on the worst back data pattern.

In the illustrated embodiment of the invention shown in FIG. 3, for example, the pass voltage or the local voltage based on an ISPP pulse or sequence of ISPP pulses may be modified using different program methods and then applied to word lines. As a result, each pass voltage window shown in FIG. 3 undergoes a modification in certain direction (as indicated by an arrow). That is, a pass voltage window corresponding to a back data pattern in the A state is modified (i.e., improved) to a pass voltage window corresponding to a back data pattern in the B state. In contrast, a pass voltage window corresponding to a back data pattern in the B state is not modified. A pass voltage window corresponding to a back data pattern in the C state is modified (i.e., degraded) to a pass voltage window corresponding to a back data pattern in the B state. A pass voltage window corresponding to a back data pattern in the D state is modified (again degraded) to a pass voltage window corresponding to a back data pattern in the C state, and a pass voltage window corresponding to a back data pattern in the E state is modified (again degraded) to a pass voltage window corresponding to a back data pattern in the D state. In this manner, as one example, the disparate characteristics of the pass voltage windows are equalized in accordance with their corresponding back data patterns.

Thus, according to one embodiment of the invention, the pass voltage window corresponding to a back data pattern in the A state improves, but the pass voltage windows corresponding to back data patterns in the at least one of the C, D and E states degrades. Yet, as previously noted, the pass voltage window performance characteristic for a memory cell array is determined according to its worst back data pattern. Accordingly, the pass voltage window performance characteristics for the foregoing embodiment are improved overall.

Figure 4:
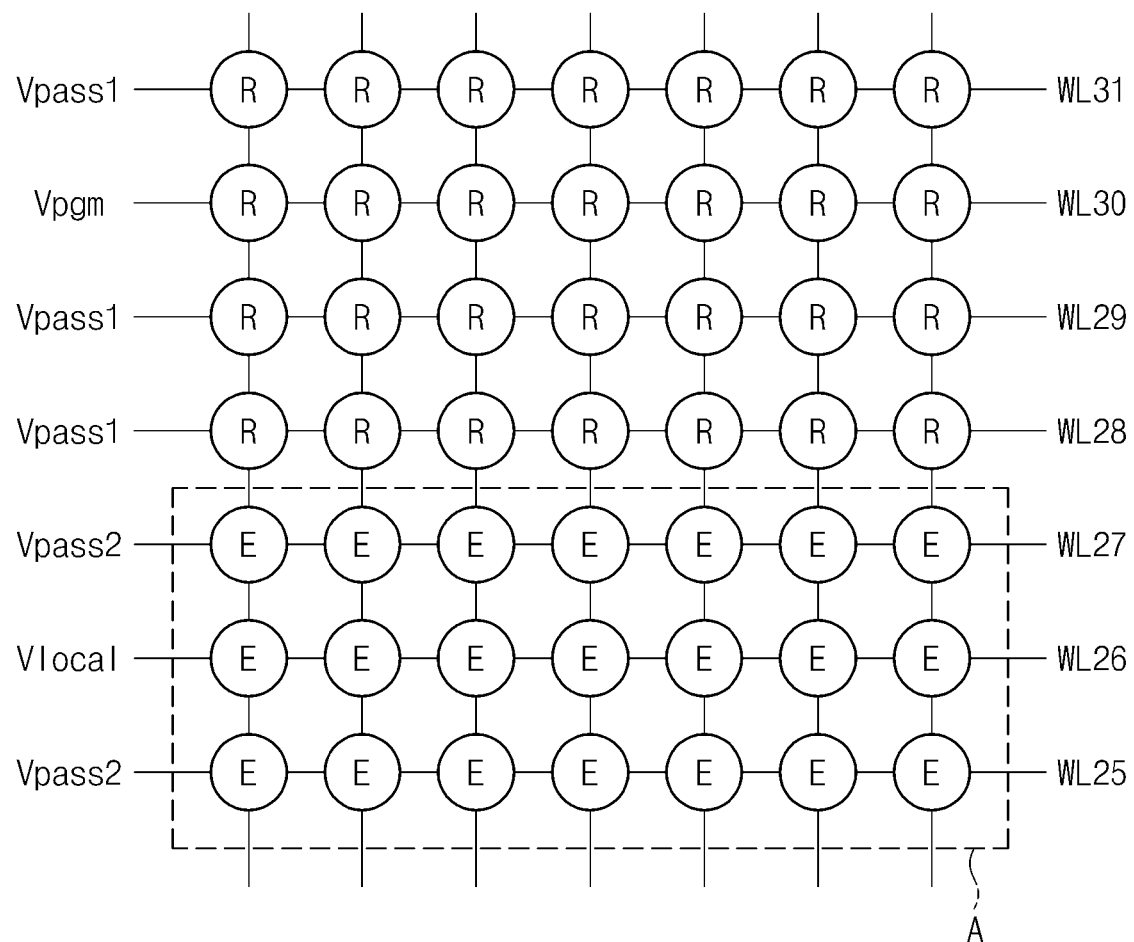
FIG. 4 is a diagram illustrating the states of the memory cells of the memory cell array in FIG. 1.
Figure 5:
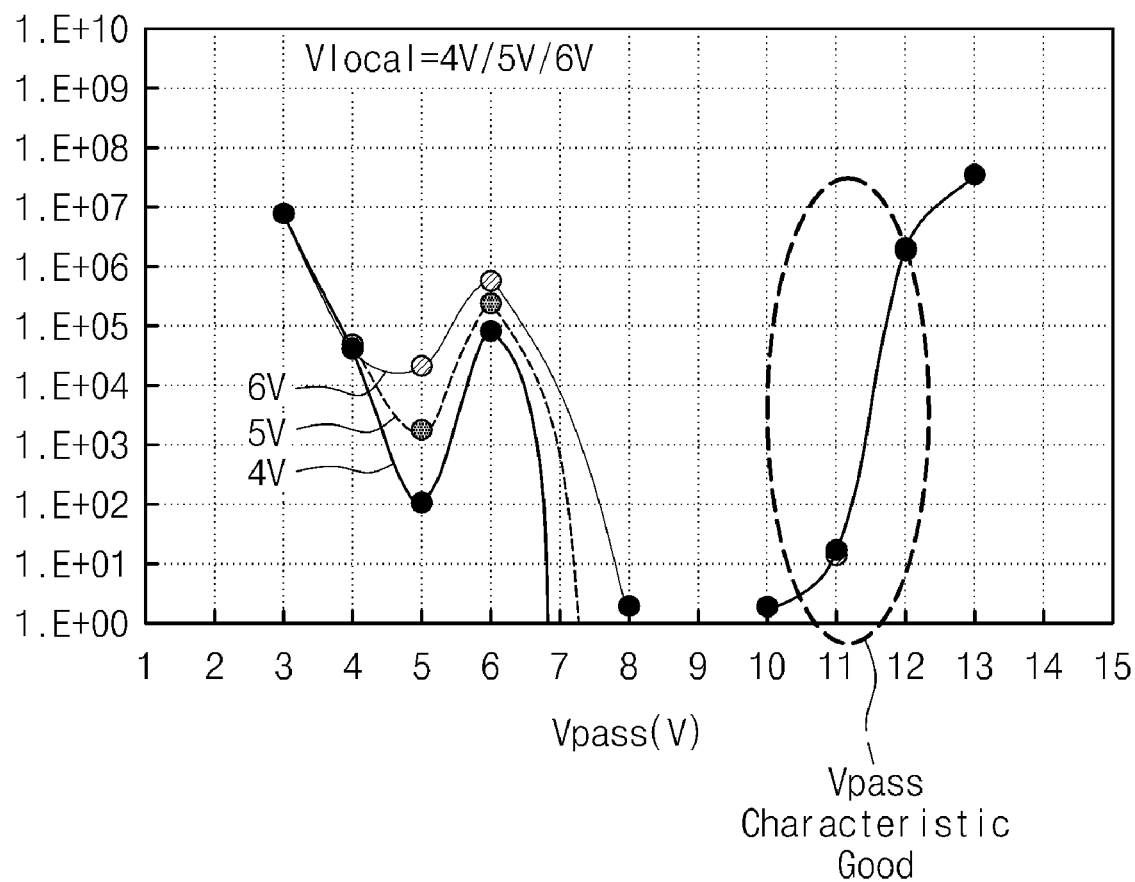
FIG. 5 is a diagram illustrating the pass voltage window for the memory cell array in FIG. 2.

FIG. 4 is a diagram further illustrating the respective states for memory cells in a portion of the memory cell array 111 shown in FIGS. 1 and 2. FIG. 5 is a diagram illustrating a corresponding pass voltage window for the memory cell array 11 of FIGS. 1 and 2.

Referring collectively to FIGS. 1 and 4, the voltage generator 114 applies a program voltage Vpgm, a first pass voltage Vpass1, a second pass voltage Vpass2 and a local voltage Vlocal to the memory cell array 111 through the decoder 113. The memory cells of the memory cell array 111, as shown in FIG. 2, are programmed. If the memory cells of a thirtieth word line WL30 are programmed, the program voltage Vpgm is applied to the thirtieth word line WL30, and the first and second pass voltages Vpass1 and Vpass2 or the local voltage Vlocal are applied to other word lines.

Referring to FIGS. 1 through 5, all the memory cells in a region designated "A" are in an erased state. The memory cells outside of region "A" are programmed to random data values. That is, both programmed state and erased state memory cells exist within the memory cells located outside of the "A" region. When the local voltage Vlocal is applied to the "A" region including only memory cells having the erased state, a well understood charge sharing phenomenon occurs. Accordingly, if the local voltage decreases, the possibility of a program voltage disturb improves. That is, as shown in FIG. 5, an increase in the local voltage Vlocal determines the likelihood of a program voltage disturb occurring.

Figure 6:
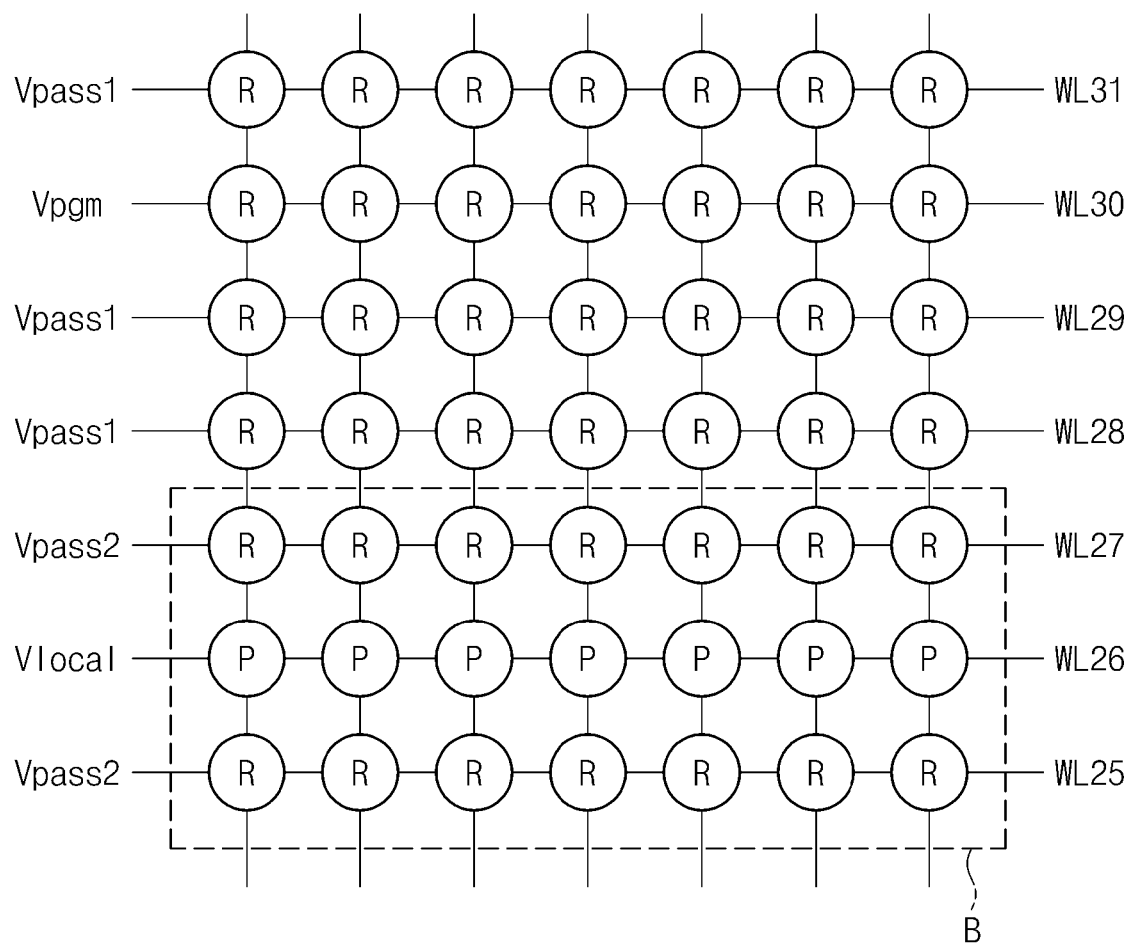
FIG. 6 is a diagram illustrating other states for the memory cells of the memory cell array in FIG. 1.
Figure 7:
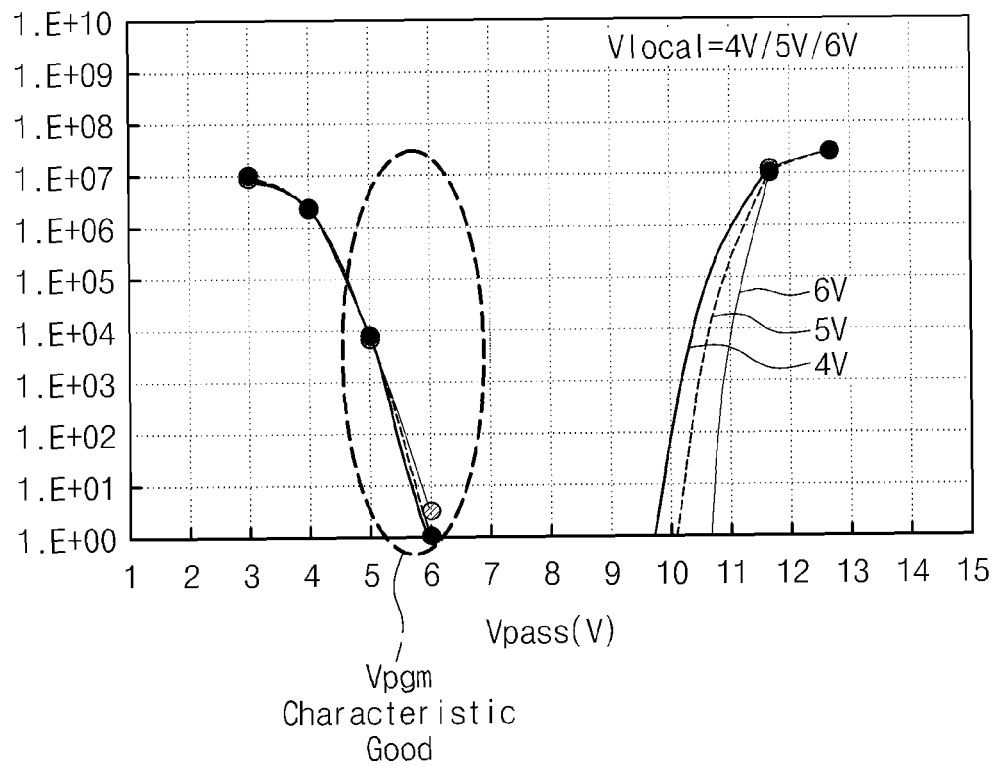
FIG. 7 is a graph illustrating the pass voltage window for the memory cell array in FIG. 6.

FIG. 6 is a diagram illustrating another exemplary collection of memory cells states for the memory cells in a portion of the memory cell array 111 in FIGS. 1 and 2. FIG. 7 is a graph illustrating a pass voltage window for the memory cell array of FIG. 6.

Referring collectively to FIGS. 1 and 6, the memory cells of the memory cell array 111 are assumed to be programmed as described above. If the memory cells of the thirtieth word line WL30 are programmed, the program voltage Vpgm is applied to the thirtieth word line WL30, and the first and second pass voltages Vpass1 and Vpass2 or the local voltage Vlocal are applied to other word lines.

Referring to FIGS. 6 and 7, certain memory cells corresponding to a word line to which the local voltage Vlocal is applied and arranged within the memory cells of a designated "B" region are assumed to be a programmed state. The memory cells outside of the "B" region are again assumed to be programmed to random data values. Thus, memory cells having a programmed state or an erased state may exist in the memory cells outside of the "B" region.

When the local voltage increases in the B region of a programmed state, hot carrier migration does not occur and the pass voltage window improves accordingly. When the pass voltage increases, however, the likelihood of pass voltage disturb increases and thus the pass voltage window degrades. That is, as shown in FIG. 5, the increase in the local voltage has more influence on the pass voltage window than the increase of the pass voltage. See, FIG. 7.

FIGS. 8 through 11 are graphs illustrating the application of the pass voltage and the local voltage according to various embodiments of the invention.

Referring to FIGS. 8 through 11, a first region Region-1 corresponds to the initiation of a program pulse based on a defined ISPP, a second region Region-2 corresponds to the middle of the program pulse based on the ISPP, and a third region Region-3 corresponds to the end of the program pulse based on the ISPP.

Figure 8:
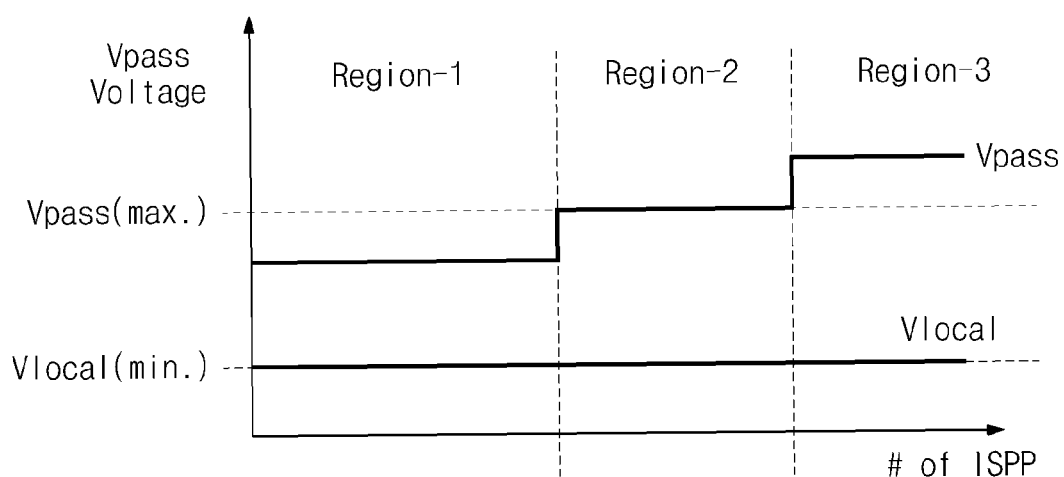
FIGS. 8 through 11 are graphs illustrating exemplary application of a pass voltage and a local voltage according to certain embodiments of the invention.

As shown in FIG. 8, in the first region Region-1, a pass voltage Vpass less than the maximum of the pass voltage is applied and a local voltage Vlocal equal to the minimum of the local voltage is applied. In the second region Region-2, the pass voltage Vpass equal to the maximum of the pass voltage is applied and the local voltage Vlocal equal to the minimum of the local voltage is applied. In the third region Region-3, the pass voltage Vpass greater than the maximum of the pass voltage is applied and the local voltage Vlocal equal to the minimum of the local voltage is applied. In the first region Region-1, therefore, a voltage application policy for the pass voltage and the local voltage in FIG. 8 applies the relatively lower pass voltage (Vpass) thereby improving the program voltage disturb.

Figure 9:
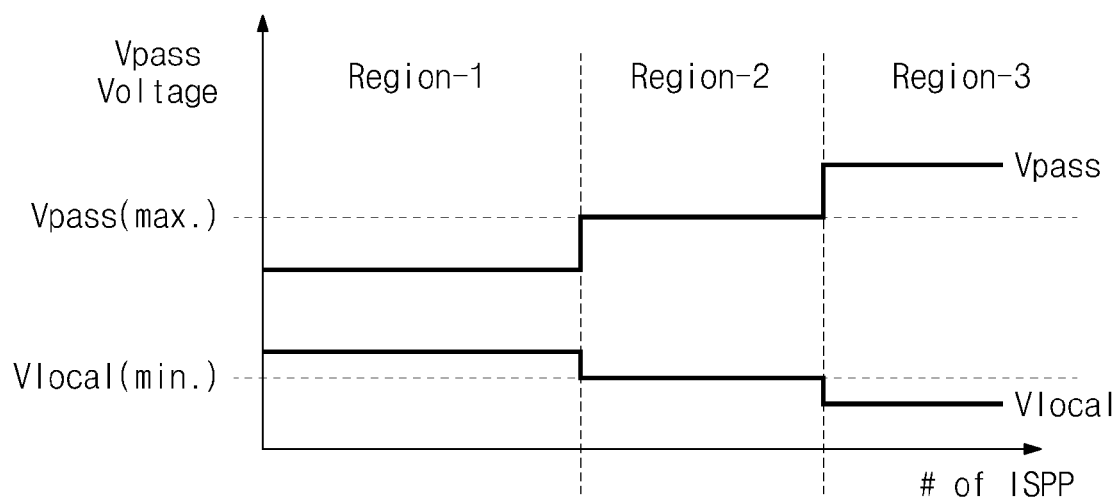

As shown in FIG. 9, in the first region Region-1, the pass voltage Vpass less than the maximum of the pass voltage is applied and the local voltage Vlocal greater than the minimum of the local voltage is applied. In the second region Region-2, the pass voltage Vpass equal to the maximum of the pass voltage is applied and the local voltage Vlocal equal to the minimum of the local voltage is applied. In the third region Region-3, the pass voltage Vpass greater than the maximum of the pass voltage is applied and the local voltage Vlocal less than the minimum of the local voltage is applied. Accordingly, the relatively lower pass voltage Vpass is applied in the first region Region-1 and the local voltage Vlocal decreases in the third region Region-3, and thus, a voltage application policy for the pass voltage and the local voltage in FIG. 9 further improves the program voltage disturb than that of FIG. 8.

Figure 10:
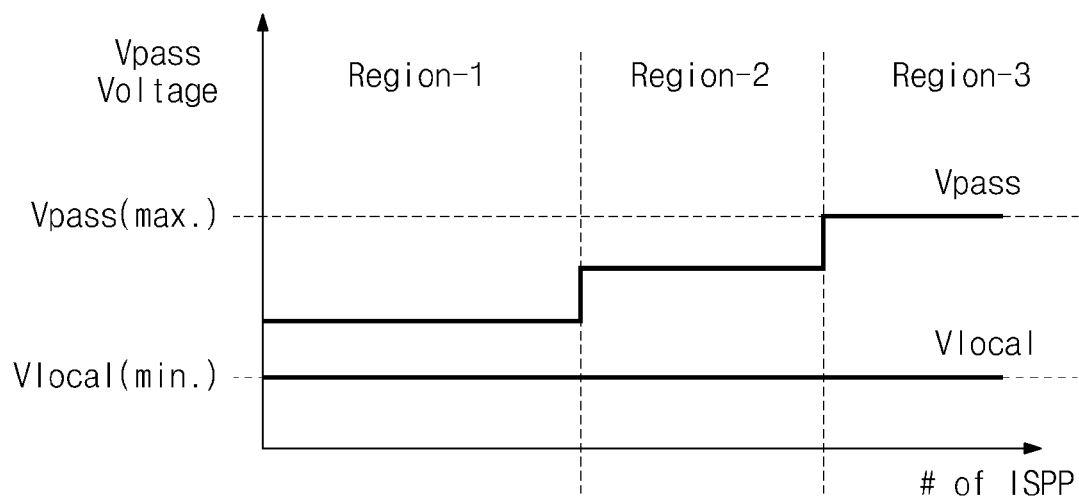

As shown in FIG. 10, in the first region Region-1, the pass voltage Vpass less than the maximum of the pass voltage is applied and the local voltage Vlocal equal to the minimum of the local voltage is applied. In the second region Region-2, the pass voltage Vpass greater than the pass voltage of the first region and less than the maximum of the pass voltage is applied, and the local voltage Vlocal equal to the minimum of the local voltage is applied. In the third region Region-3, the pass voltage Vpass equal to the maximum of the pass voltage is applied and the local voltage Vlocal equal to the minimum of the local voltage is applied.

Accordingly, a voltage application policy for the pass voltage and the local voltage in FIG. 9 applies the relatively lower pass voltage Vpass in the first and second regions Region-1 and Region-2, leading to the improvement of the pass voltage disturb.

Figure 11:
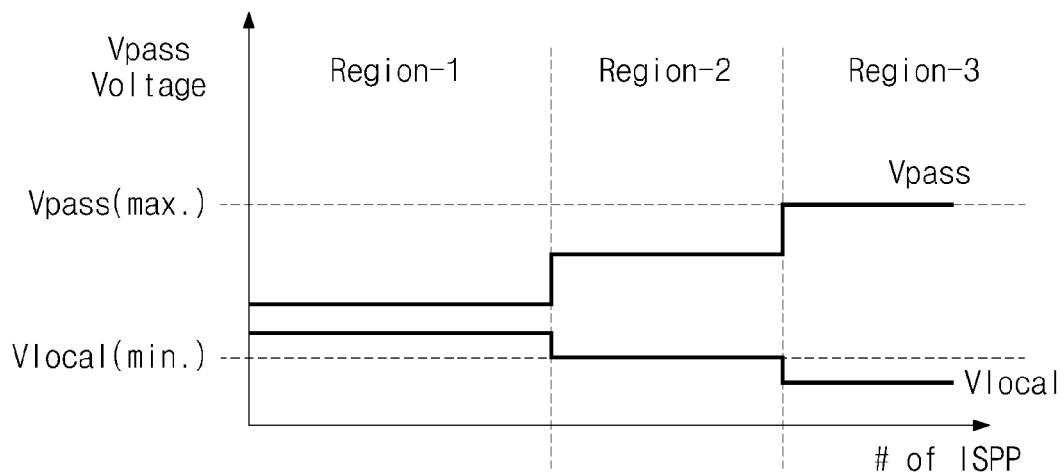

As shown in FIG. 11, in the first region Region-1, the pass voltage Vpass less than the maximum of the pass voltage is applied and the local voltage Vlocal greater than the minimum of the local voltage is applied. In the second region Region-2, the pass voltage Vpass greater than the pass voltage of the first region and less than the maximum of the pass voltage is applied, and the local voltage Vlocal equal to the minimum of the local voltage is applied. In the third region Region-3, the pass voltage Vpass equal to the maximum of the pass voltage is applied and the local voltage Vlocal less than the minimum of the local voltage is applied.

Accordingly, a voltage application policy for the pass voltage and the local voltage in FIG. 11 applies the relatively lower pass voltage Vpass in the first and second regions Region-1 and Region-2, and the local voltage Vlocal decreases in the third region Region-3, improving the program voltage disturb and the pass voltage disturb.

Figure 21:
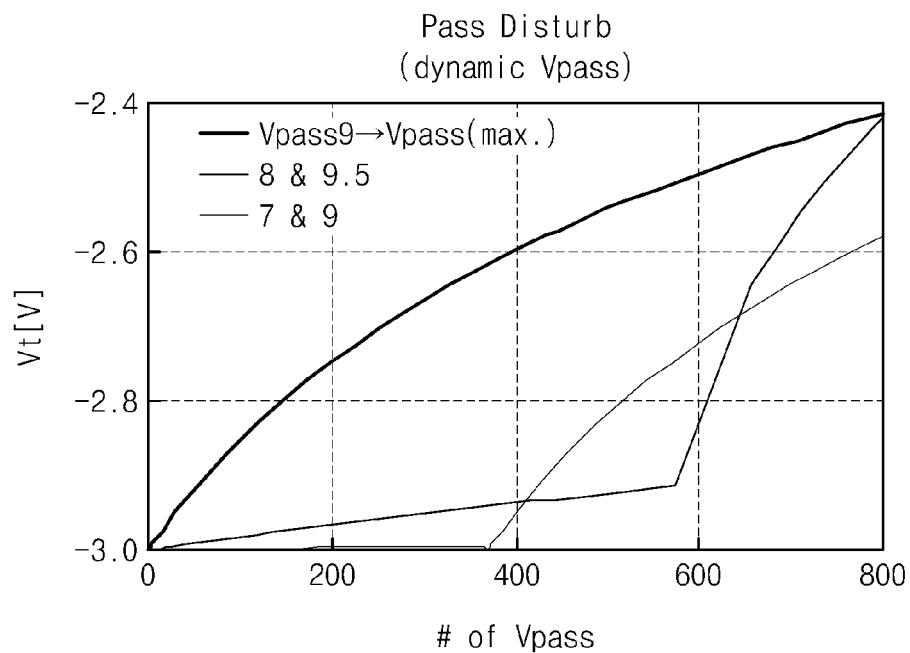
FIG. 21 is a graph illustrating modification if a threshold voltage based on a number of times the first and second pass voltages are applied as shown in Table 3.
Figure 22:
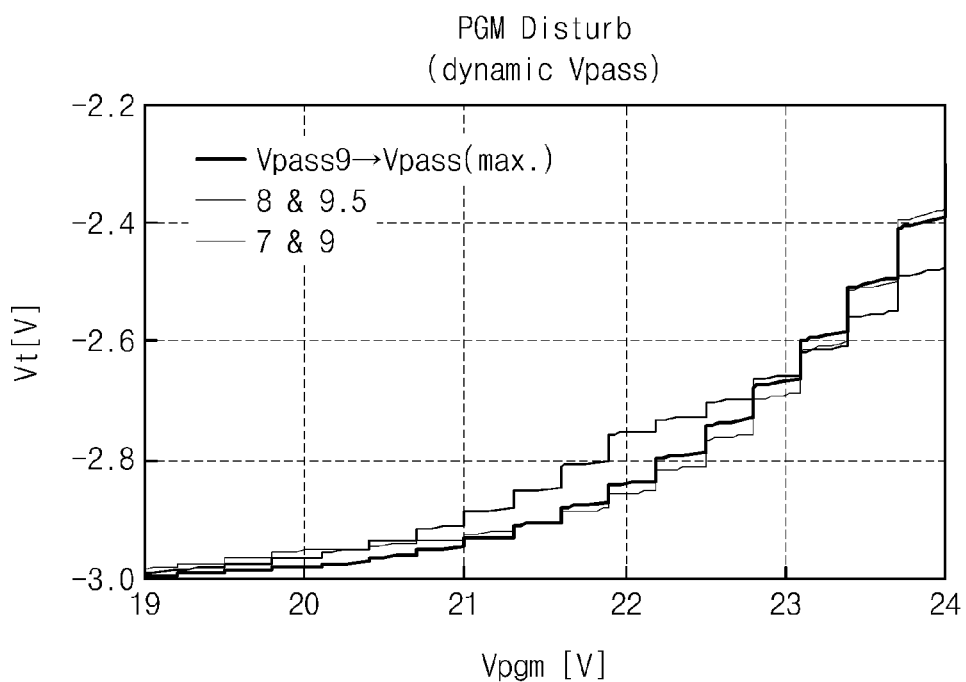
FIG. 22 is a graph illustrating modification of a threshold voltage based on a program voltage pulse as shown in Table 3.

FIGS. 21 and 22 illustrate exemplary embodiments of the invention in which the voltage application policies for the pass voltage and the local voltage, as show in FIGS. 8 through 11, have been applied.

Figure 12:
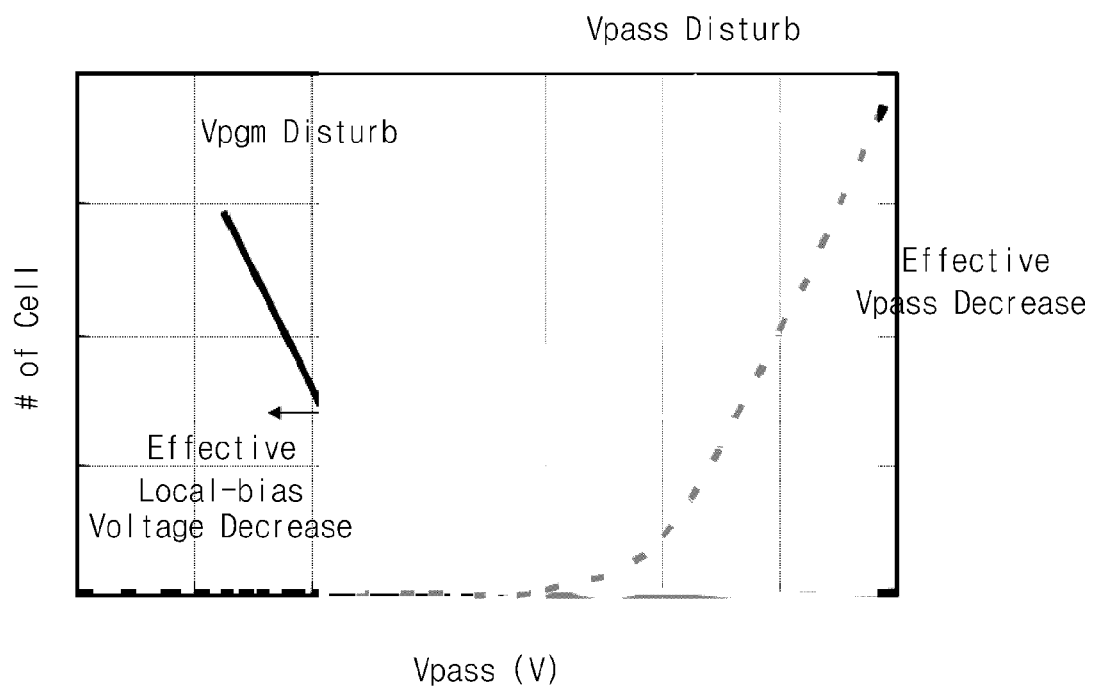
FIG. 12 is a graph illustrating the comparison results for the pass voltage windows of FIGS. 5 and 7.

FIG. 12 is a graph illustrating comparative results for the pass voltage windows corresponding to the embodiments illustrated in FIGS. 5 and 7.

Referring to FIG. 12, when the state of the memory cell array is as illustrated in FIG. 4, the pass voltage window improves according to a decrease in the local voltage. When the state of the memory cell array is as illustrated in FIG. 6, the pass voltage window improves according to a decrease in the pass voltage. Therefore, the exemplary voltage application policies for the pass voltage and the local voltage illustrated in relation to the embodiment shown in FIGS. 10 and 11 improve the pass voltage disturb. The voltage application policies for the pass voltage and the local voltage in relation to the embodiments shown in FIGS. 8, 9 and 11, moreover, improve the program voltage disturb.

Figure 13:
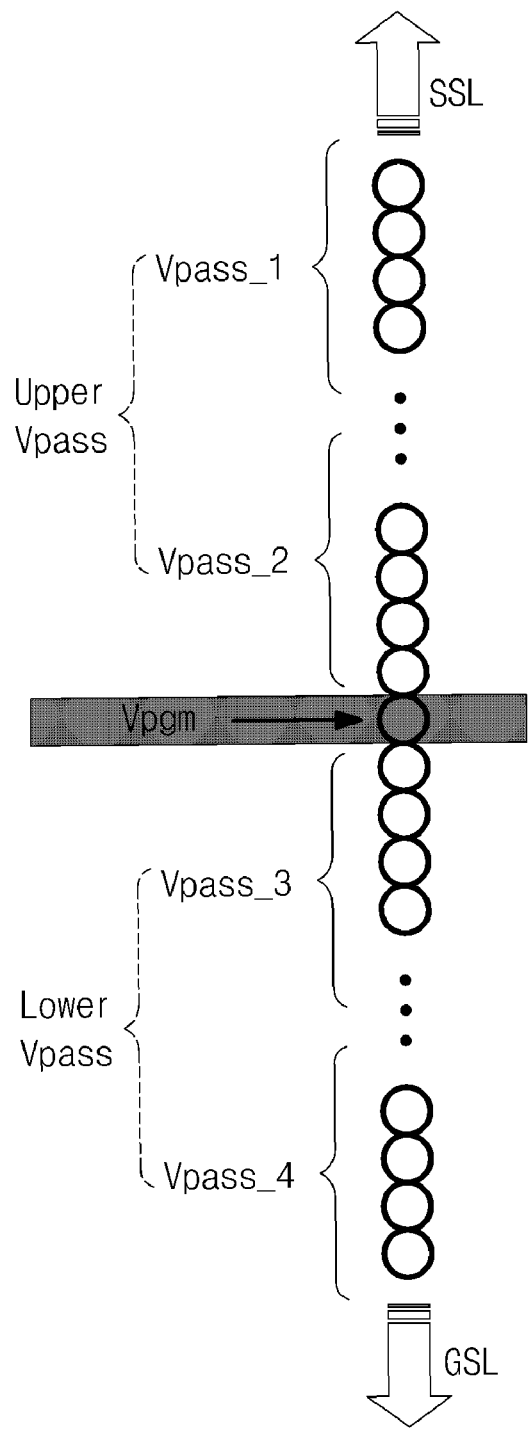
FIG. 13 is a diagram further illustrating any one of the string cells of the memory cell array in FIG. 4.

FIG. 13 is a diagram illustrating any one of the memory cell string for the memory cell array of FIG. 4. According to an embodiment of the invention, the program voltage Vpgm is applied to a memory cell which is disposed in the center of the memory cell string under the conditions illustrated in FIG. 8. An upper pass voltage (Upper Vpass) is applied to an upper word line and a lower pass voltage (Lower Vpass) is applied to a lower word line with respect to a memory cell to which the program voltage Vpgm is applied. The upper pass voltage has a voltage level greater than that of the lower pass voltage. The upper pass voltage includes first and second pass voltages Vpass_1 and Vpass_2, and the lower pass voltage includes third and fourth pass voltages Vpass_3 and Vpass_4. According to the embodiment of the invention shown in FIG. 13, the resulting first through fourth pass voltages Vpass_1-Vpass_4 are used. However, more than four pass voltages may be used in other embodiments of the invention.

Figure 14:
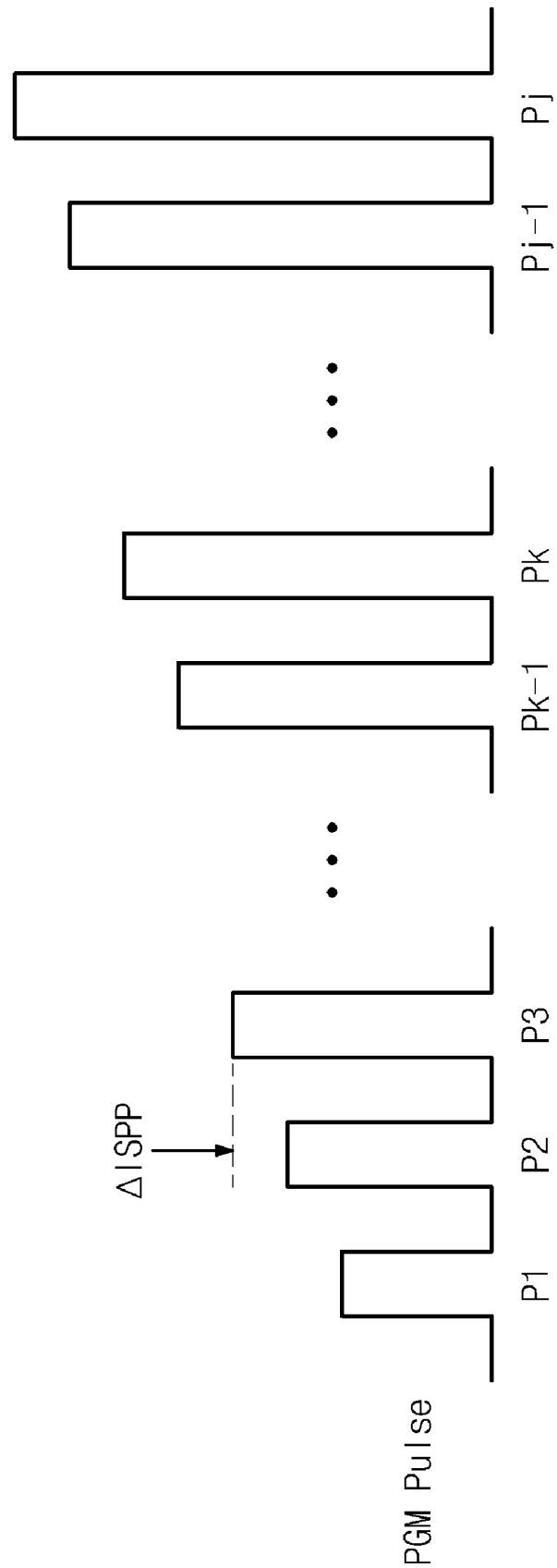
FIG. 14 is a timing diagram illustrating a program voltage pulse according to an embodiment of the present invention.

Table 1 below shows a program method based on a program voltage of stepped pulses, as shown in FIG. 14. As further illustrated in FIG. 15, the program voltage Vpgm increases incrementally in a step-pulse type according to the ISPP.

TABLE 1

| ISPP Pulse | P1 | P2 | P3 | ... | Pk-1 | Pk | ... | Pj-1 | Pj |
|---|---|---|---|---|---|---|---|---|---|
| By ISPP Pulse | Type-1 | Type-2 | Type-3 | ... | Type-k-1 | Type-k | ... | Type-j-1 | Type-j |
| By ISPP Pulse Group | | Type-1 | | ... | | Type-2 | ... | | Type-3 |

Referring to FIG. 14, while first to third program pulse voltages P1 to P3 are being applied, a pass voltage Vpass or a local voltage Vlocal based on a first type (Type-1) voltage application policy. While (k−1)th and kth program voltage pulses Pk−1 and Pk are being applied, a pass voltage Vpass or a local voltage Vlocal based on a second type (Type-2) voltage application policy is applied. While (j−1)th and jth program voltage pulses Pj−1 and Pj are being applied, a pass voltage Vpass or a local voltage Vlocal based on a third type (Type-3) voltage application policy is applied.

Figure 15:
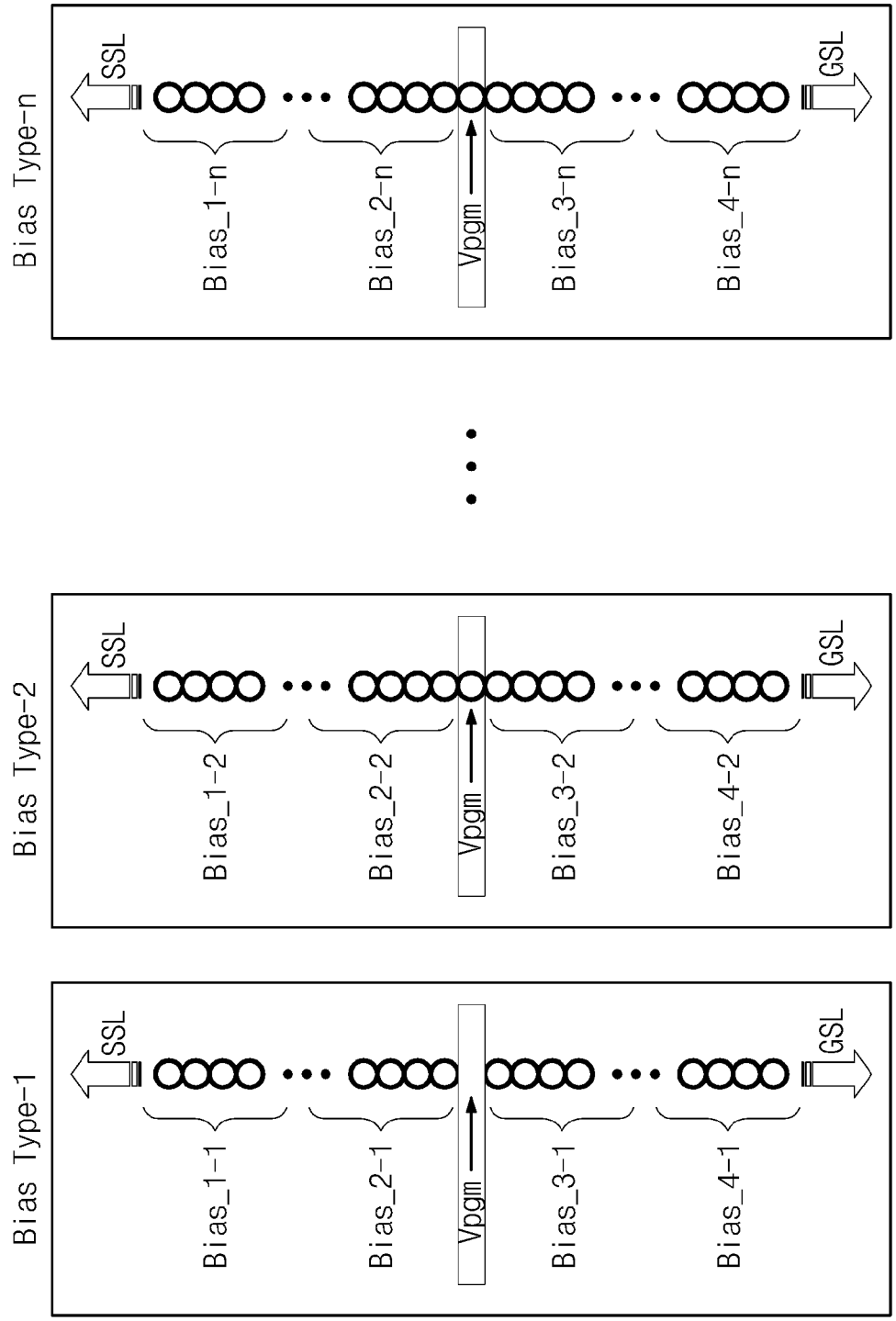
FIG. 15 is a diagram illustrating one example of applying different program schemes to string cells according to an embodiment of the present invention.

According to an embodiment of the invention, the applied pass voltages may be controlled according to the program voltage pulses. The program voltage pulses may be divided into several groups, and the applied pass voltages may be controlled according to the groups. While the (j−1)th and jth program voltage pulses Pj−1 and Pj (over which the program voltage disturb intensively occurs) are being applied, the pass voltage Vpass or the local voltage Vlocal may be controlled. As illustrated in FIG. 15, the different pass voltages and local voltages may be applied according to location of particular memory cell with a sting of memory cells.

Table 2 below shows the stress of the pass voltages based on the application of the step pulses of the program voltages.

TABLE 2

| ISPP Pulse | P1 | P2 | P3 | ... | Pk-1 | Pk | ... | Pj-1 | Pj | Vpass Stress |
|---|---|---|---|---|---|---|---|---|---|---|
| Conventional ISPP | Constant High Vpass Voltage | | | | | | | | | $Vpass_H \times n$ |
| Dynamic Upper Vpass | Low Vpass_u | | | ... | Middle Vpass_u | | ... | High Vpass_u | | $(Vpass_L \times n_L) + (Vpass_M \times n_M) + (Vpass_H \times n_H)$ |
| Dynamic Lower Vpass | Low Vpass_k | | | ... | Middle Vpass_l | | ... | High Vpass_l | | $(Vpass_L \times n_L) + (Vpass_M \times n_M) + (Vpass_H \times n_H)$ |

The stress of the pass voltage based on the ISPP may be expressed as "Vpass×n (the number of times)". The upper pass voltage (Upper Vpass) is applied to the upper word line and the lower pass voltage (Lower Vpass) is applied to the lower word line with respect to a memory cell to which the program voltage Vpgm is applied.

A pass voltage stress given for the memory cells of a word line to which the upper pass voltage is applied and a pass voltage stress given for the memory cells of a word line to which the lower pass voltage is applied are set forth in Table 2.

Referring to the Table 2, the pass voltage stress is proportional to a pass voltage level and the number of the program step pulses. In the pass voltage stress, low-level pass voltages (Low Vpass_u and Low Vpass_l) are applied when a program voltage pulse at an initial stage is applied, middle-level pass voltages (Middle Vpass_u and Middle Vpass_l) are applied when a program voltage pulse at a middle stage is applied, and high-level pass voltages (High Vpass_u and High Vpass_l) are applied when a program voltage pulse at a final stage is applied. Accordingly, many low-level pass voltages are applied at the initial and middle stages of the program voltage pulse and the high-level pass voltage is applied at the final stage of the program voltage pulse to prevent the program voltage disturb, and thus, the pass voltage stress decreases.

Figure 16:
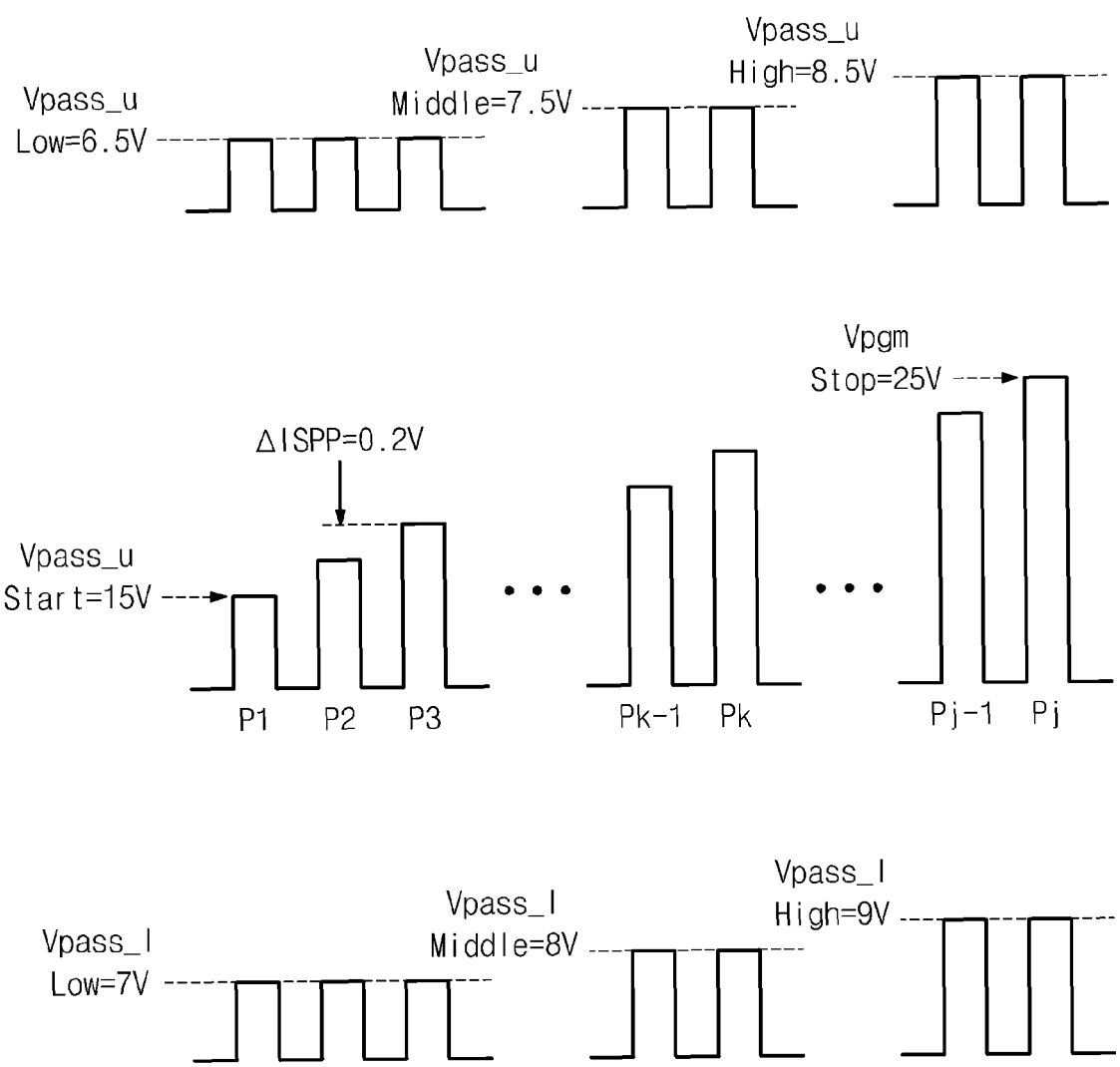
FIG. 16 is a timing diagram illustrating the upper and lower pass voltages synchronously applied with the program voltage pulse of FIG. 14.

FIG. 16 is a timing diagram illustrating the upper and lower pass voltages synchronously applied with the program voltage pulse in FIG. 14.

Referring to FIG. 16, the program voltage Vpgm increases by 0.2V from 15V at an initial stage and is applied up to 25V. At this point, the upper pass voltage Vpass_u and the lower pass voltage Vpass_l are applied according to the program voltage pulses.

The upper pass voltage Vpass_u of 6.5V is applied in response to the program voltage pulse at an initial stage, the upper pass voltage Vpass_u of 7.5V is applied in response to the program voltage pulse at a middle stage, and the upper pass voltage Vpass_u of 8.5V is applied in response to the program voltage pulse at a final stage. The lower pass voltage Vpass_l of 7V is applied in response to the program voltage pulse at the initial stage, the lower pass voltage Vpass_l of 8V is applied in response to the program voltage pulse at the middle stage, and the lower pass voltage Vpass_l of 9V is applied in response to the program voltage pulse at a final stage. According to the illustrated embodiment of invention, the lower pass voltage Vpass_l applied is greater than the upper pass voltage Vpass_u for preventing charge sharing.

Figure 17:
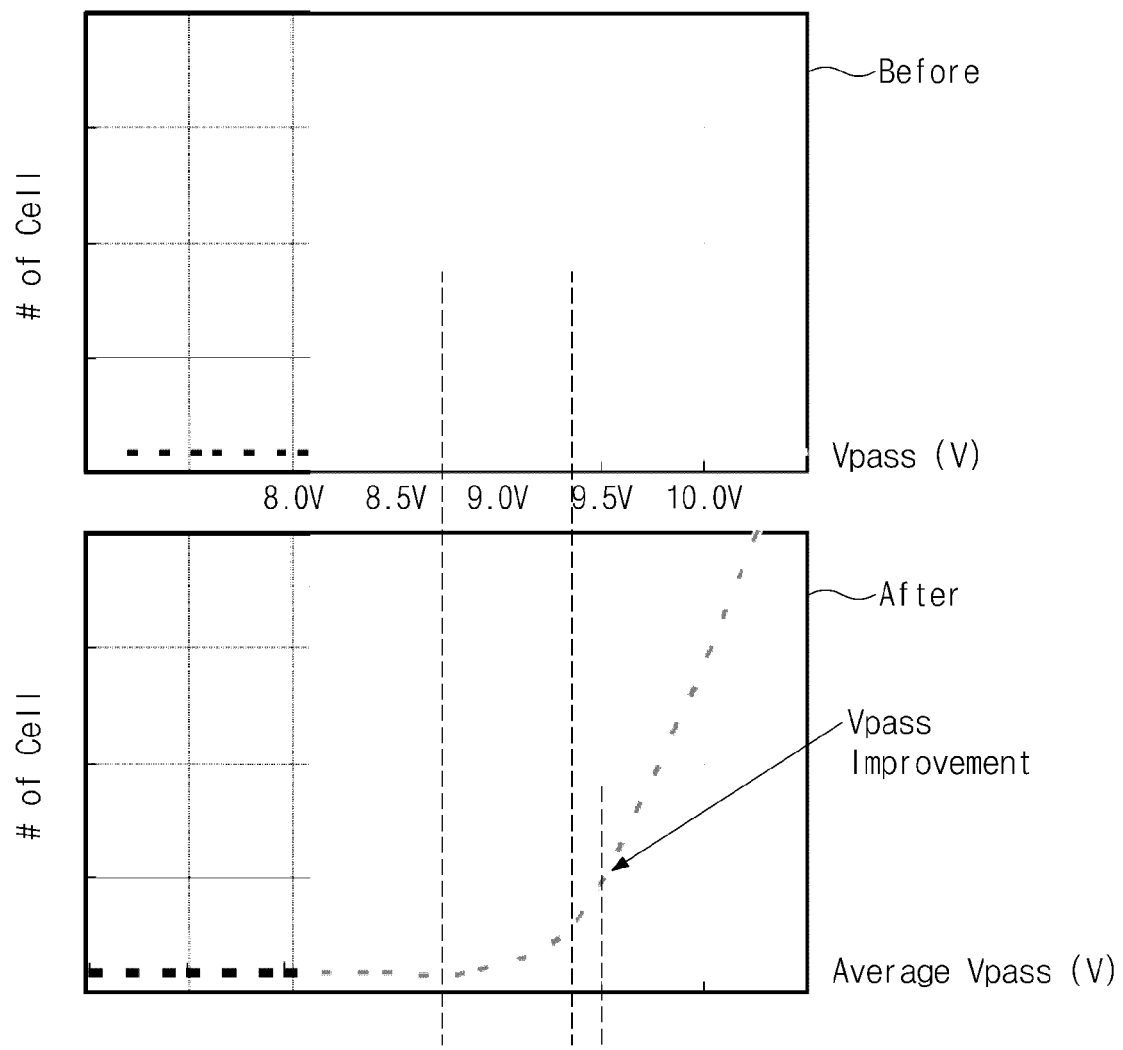
FIG. 17 is a diagram illustrating the pass voltage windows based on the pass voltages of FIG. 16.

FIG. 17 is a diagram illustrating a pass voltage window corresponding to the pass voltages of FIG. 16.

Comparing the states before and after the illustrated embodiment of the invention is applied, as shown FIG. 17, it can be seen that following application of the voltages of FIG. 16, the pass voltage disturb decreases in the pass voltage window and the pass voltage window therefore improves. Thus, according to an embodiment of the invention, the same result (i.e., the same threshold voltage) may be obtained through application of the relatively lower pass voltage, and thus the pass voltage disturb decreases. Accordingly, the pass voltage window improves.

Embodiments of the present invention, moreover, may be applied to local boosting. The foregoing outcome is further expanded upon by the embodiment of the invention described in relation to FIGS. 18 through 20 which applies analogous voltages during a local boosting operation.

Figure 18:
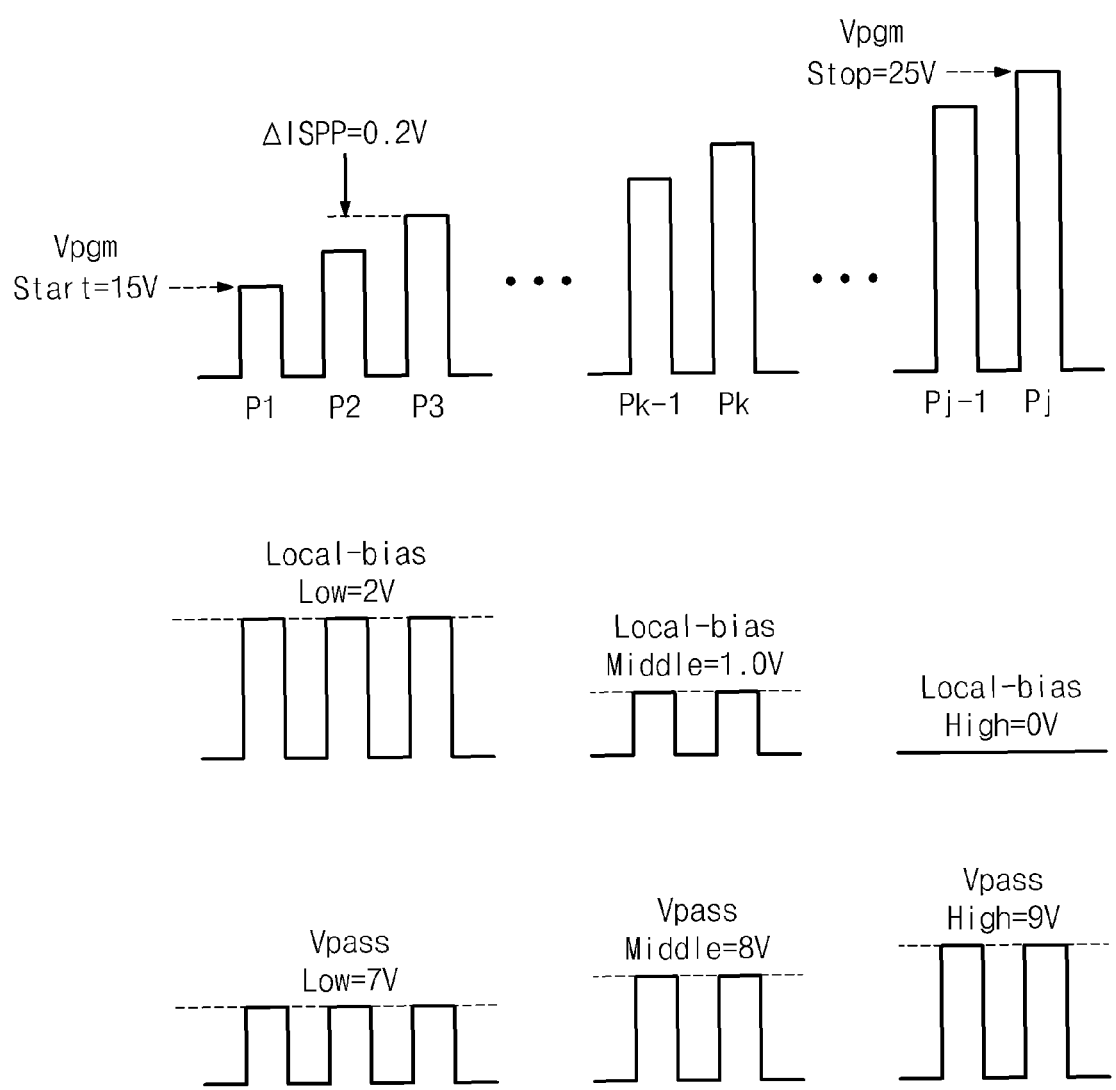
FIG. 18 is a timing diagram illustrating the pass voltage and the local voltage synchronously applied with the program voltage pulse of FIG. 14.

FIG. 18 is a timing diagram illustrating the pass voltage and the local voltage synchronously applied with the program voltage pulse in FIG. 14.

Referring to FIG. 18, the program voltage Vpgm increases by 0.2V from 15V at an initial stage and is applied up to 25V. At this point, the pass voltage Vpass and the local voltage Vlocal are applied in response to the program voltage pulses.

The pass voltage Vpass of 7V is applied in response to the program voltage pulses P1 to P3 at an initial stage, the pass voltage Vpass of 8V is applied in response to the program voltage pulses Pk−1 and Pk at a middle stage, and the pass voltage Vpass of 9V is applied in response to the program voltage pulses Pj−1 and Pj at a final stage. The local voltage Vlocal of 2V is applied in response to the program voltage pulses P1 to P3 at the initial stage, the local voltage Vlocal of 1.0V is applied in response to the program voltage pulses Pk−1 and Pk at the middle stage, and the local voltage Vlocal of 0V is applied in response to the program voltage pulses Pj−1 and Pj at the final stage. That is, as the local voltage decreases, the effect of the local boosting increases. However, hot carrier migration may occur.

Figure 19:
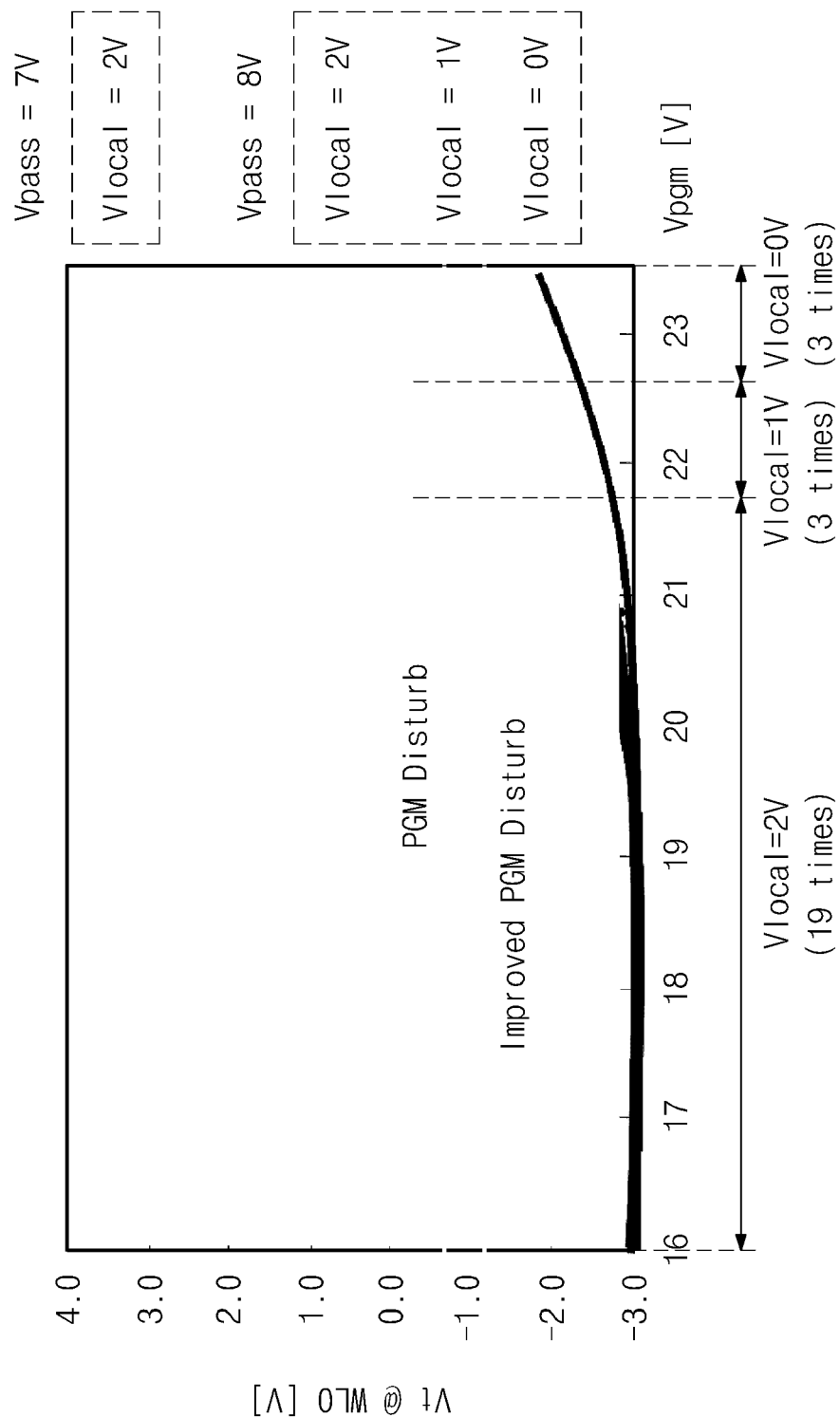
FIG. 19 is a graph illustrating the rate of a program voltage to a threshold voltage based on a self-boosting program.

FIG. 19 is a graph illustrating the rate of a program voltage to a threshold voltage based on a self-boosting program.

Referring to FIG. 19, the abscissa axis is the voltage level of the program voltage Vpgm, and the ordinate axis is the threshold voltage Vt of the memory cell.

As the local voltage Vlocal increases, the effect of the local boosting decreases, and thus, the memory cell of a program-inhibited string cell is programmed. That is, the program voltage disturb occurs. While the program voltage Vpgm from 16V to 23V is being applied, the increase of the threshold voltage Vt is greatest when the pass voltage Vpass is 7V and the local voltage Vlocal is 2V, whereas the increase of the threshold voltage Vt is least when the pass voltage Vpass is 8V and the local voltage Vlocal is 0V.

In the illustrated embodiment of the invention, the local voltage is 2V until the program voltage pulse is applied nineteen times, the local voltage is 1V until the program voltage pulse is applied three times, and the local voltage is 0V until the program voltage pulse is applied three times. That is, the local voltage Vlocal is depicted as a dotted line. That is, a threshold voltage based on the local voltage Vlocal is less than the threshold voltage Vt based on the local voltage Vlocal of 1V. When the local voltage Vlocal decreases, the pass voltage disturb increases due to the hot carrier. When the local voltage Vlocal increases, moreover, the program voltage disturb increases because the effect of the local boosting decreases.

Figure 20:
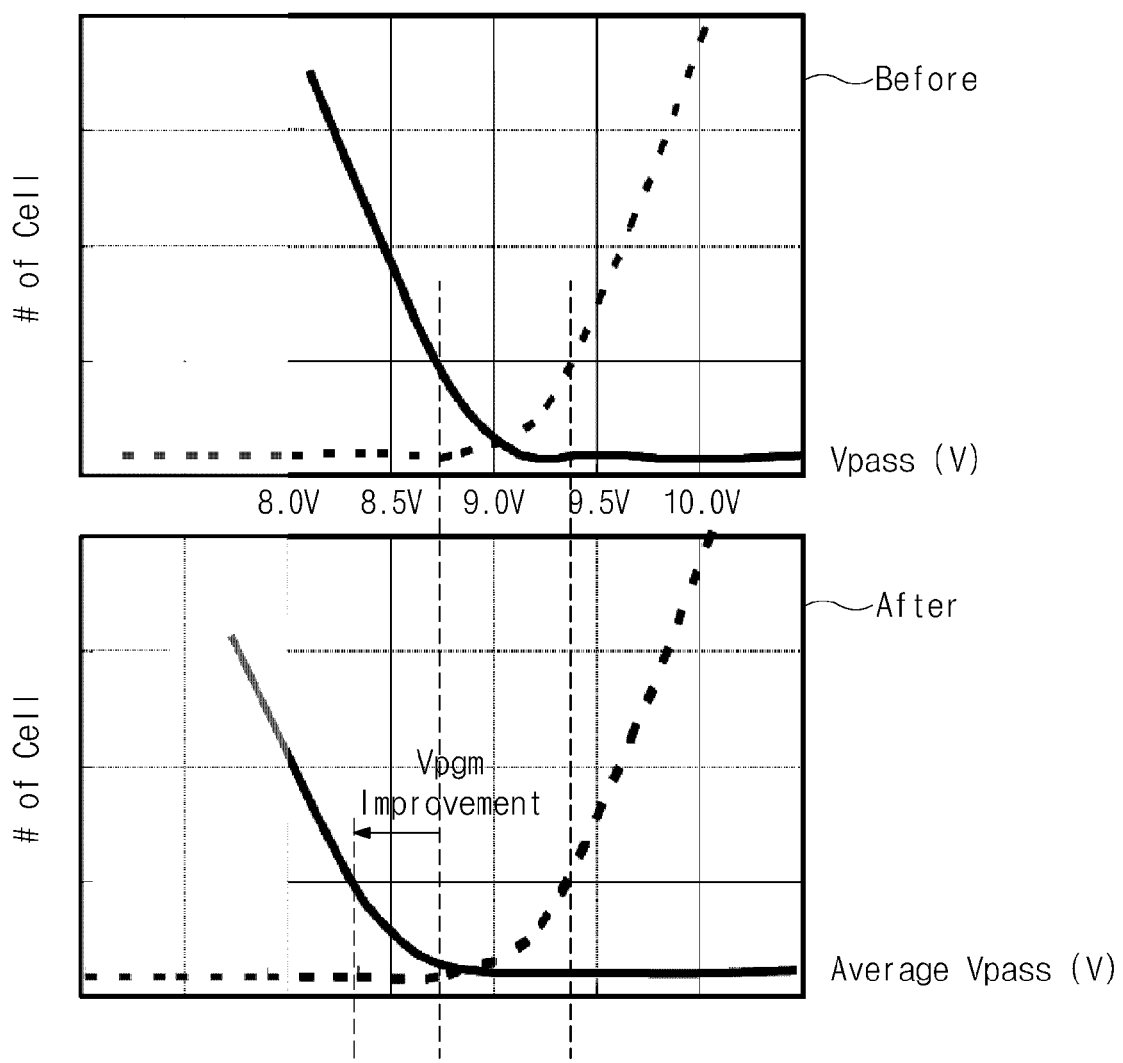
FIG. 20 is a diagram illustrating the pass voltage window based on the local voltage of FIG. 19.

FIG. 20 is a diagram illustrating the pass voltage window corresponding to the local voltage of FIG. 19.

Comparing the states before and after application of the exemplary voltages of FIG. 18 and as shown in FIG. 20, it can be seen that following the application of the exemplary voltages, the program voltage disturb decreases in the pass voltage window and the pass voltage window therefore improves.

As previously noted, FIG. 21 is a graph illustrating the modification of the threshold voltage based on the number of times first and second pass voltages are applied in the following Table 3. FIG. 22 is a graph illustrating the modification of the threshold voltage based on a program voltage pulse in the following Table 3.

TABLE 3

| Vpass1 (ISPP1) | Vpass2 (ISPP2) | Pass disturb [V] | PGM disturb [V] |
|---|---|---|---|
| 9.0 V (twenty-six times) | — | 0.6 V | 2.53 V |
| 8.0 V (nineteen times) | 9.5 V (seven times) | 0.6 V | 2.30 V |
| 7.0 V (twelve times) | 9.0 V (fourteen times) | 0.4 V | 2.53 V |

In FIG. 21, a first curve represents the rate of the number of pass voltage-application times to a threshold voltage Vt when the first and second pass voltages Vpass1 and Vpass2 are 9V. The second curve represents the rate of the number of pass voltage-application times to the threshold voltage Vt when the first pass voltages Vpass1 is 8.0V and the second pass voltages Vpass2 is 9.5V. The third curve represents the rate of the number of pass voltage-application times to the threshold voltage Vt when the first pass voltages Vpass1 is 7.0V and the second pass voltages Vpass2 is 9.0V. The pass voltage stress in the third curve is lowest. That is, the pass voltage disturb in the third curve is lowest as 0.4V. Accordingly, the pass voltage window in the third curve is widest.

In the second curve, as shown in FIG. 8, the pass voltage and the local voltage are applied. In the third curve, as shown in FIG. 10, the pass voltage and the local voltage are applied. Accordingly, a pass voltage policy based on the third curve improves the pass voltage disturb.

Referring to FIG. 22, the first curve represents the rate of the program voltage Vpgm to the threshold voltage Vt when the first and second pass voltages Vpass1 and Vpass2 are 9V and the program voltage pulse is applied twenty-six times. The second curve represents the rate of the program voltage Vpgm to the threshold voltage Vt in a case where the program voltage pulse is applied nineteen times when the first pass voltages Vpass1 is 8.0V and the program voltage pulse is applied seven times when the second pass voltages Vpass2 is 9.5V. The third curve represents the rate of the program voltage Vpgm to the threshold voltage Vt in a case where the program voltage pulse is applied twelve times when the first pass voltages Vpass1 is 7.0V and the program voltage pulse is applied fourteen times when the second pass voltages Vpass2 is 9.0V. In the second curve, as shown in FIG. 8, the pass voltage and the local voltage are applied. In the third curve, as shown in FIG. 10, the pass voltage and the local voltage are applied.

In Table 3 above, the program voltage disturb in the second curve is lowest as 2.30V. Accordingly, in the case of the pass voltage based on the second curve, the program voltage disturb improves. According to Table 3, however, in the pass voltage window of the pass voltage based on the third curve, the pass voltage disturb further improves than the program voltage disturb. In the pass voltage based on the third curve, the program voltage disturb further degrades than the pass voltage based on the second curve, but the pass voltage disturb improves much more. Accordingly, the pass voltage window improves overall.

Figure 23:
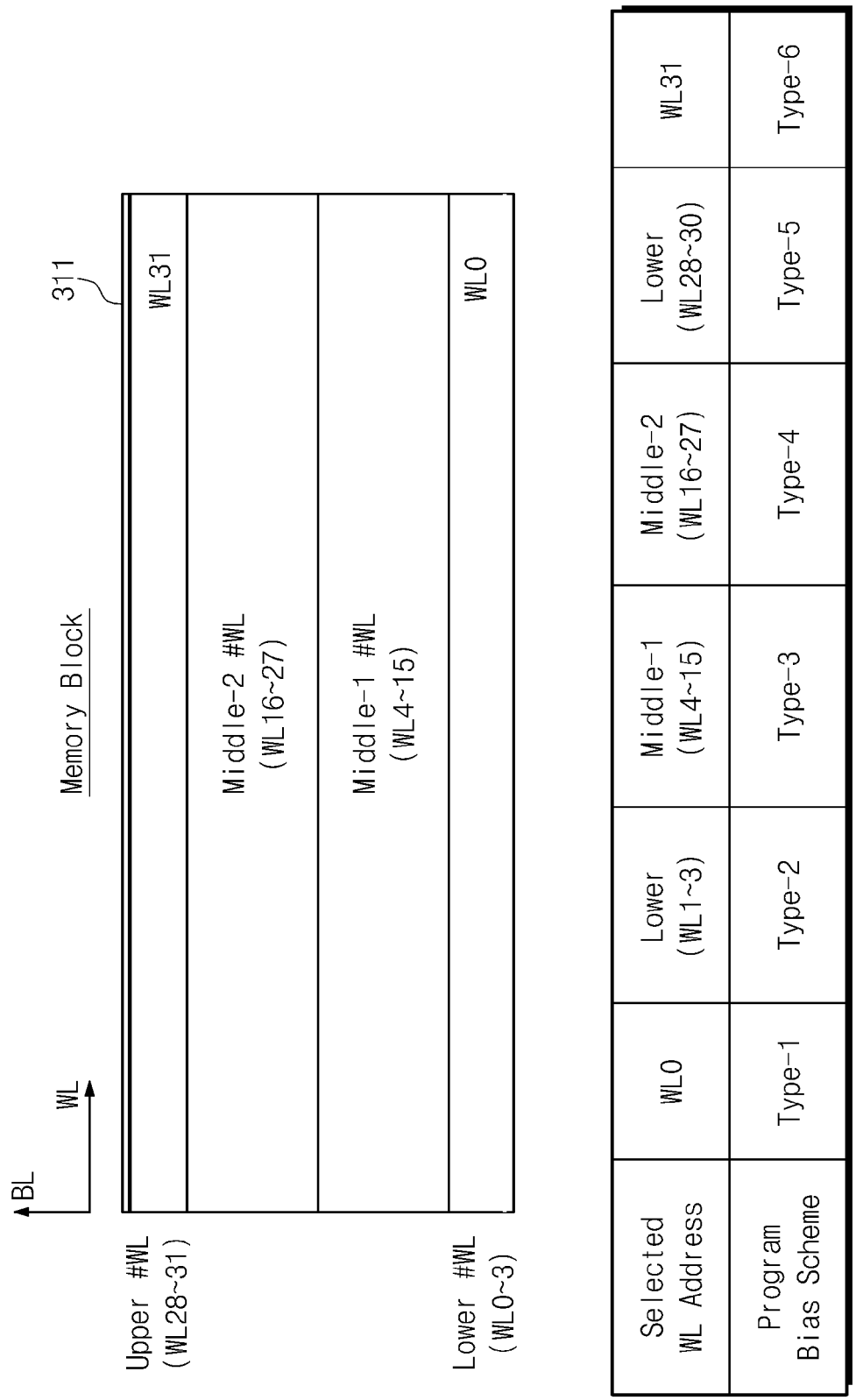
FIG. 23 is a block diagram illustrating a memory cell array according to another embodiment of the present invention.

FIG. 23 is a block diagram illustrating a memory cell array according to another exemplary embodiment of the present invention.

Referring to FIG. 23, a memory cell array 311 according to another embodiment of the invention includes thirty-two word lines. As shown in Table 4 below, the thirty-two word lines are divided into a word line WL0, word lines WL1 to WL3, word lines WL4 to WL15, word lines WL16 to WL27, word lines WL28 to WL30 and a word line WL31.

TABLE 4

| | Selected WL Address | | | | | |
|---|---|---|---|---|---|---|
| | WL0 | Lower (WL1-3) | Middle-1 (WL4-15) | Middle-2 (WL16-27) | Upper (WL28-30) | WL31 |
| Program Bias Scheme | Type-1 | Type-2 | Type-3 | Type-4 | Type-5 | Type-6 |

A first type program bias scheme is applied to a zeroth word line WL0, a second type program bias scheme is applied to first to third word lines WL1 to WL3, a third type program bias scheme is applied to fourth to fifteenth word lines WL4 to WL15, a fourth type program bias scheme is applied to sixteenth to twenty-seventh word lines WL16 to WL27, a fifth type program bias scheme is applied to twenty-eighth to thirtieth word lines WL28 to WL30, and a sixth type program bias scheme is applied to a thirty-first word line WL31.

Figure 24:
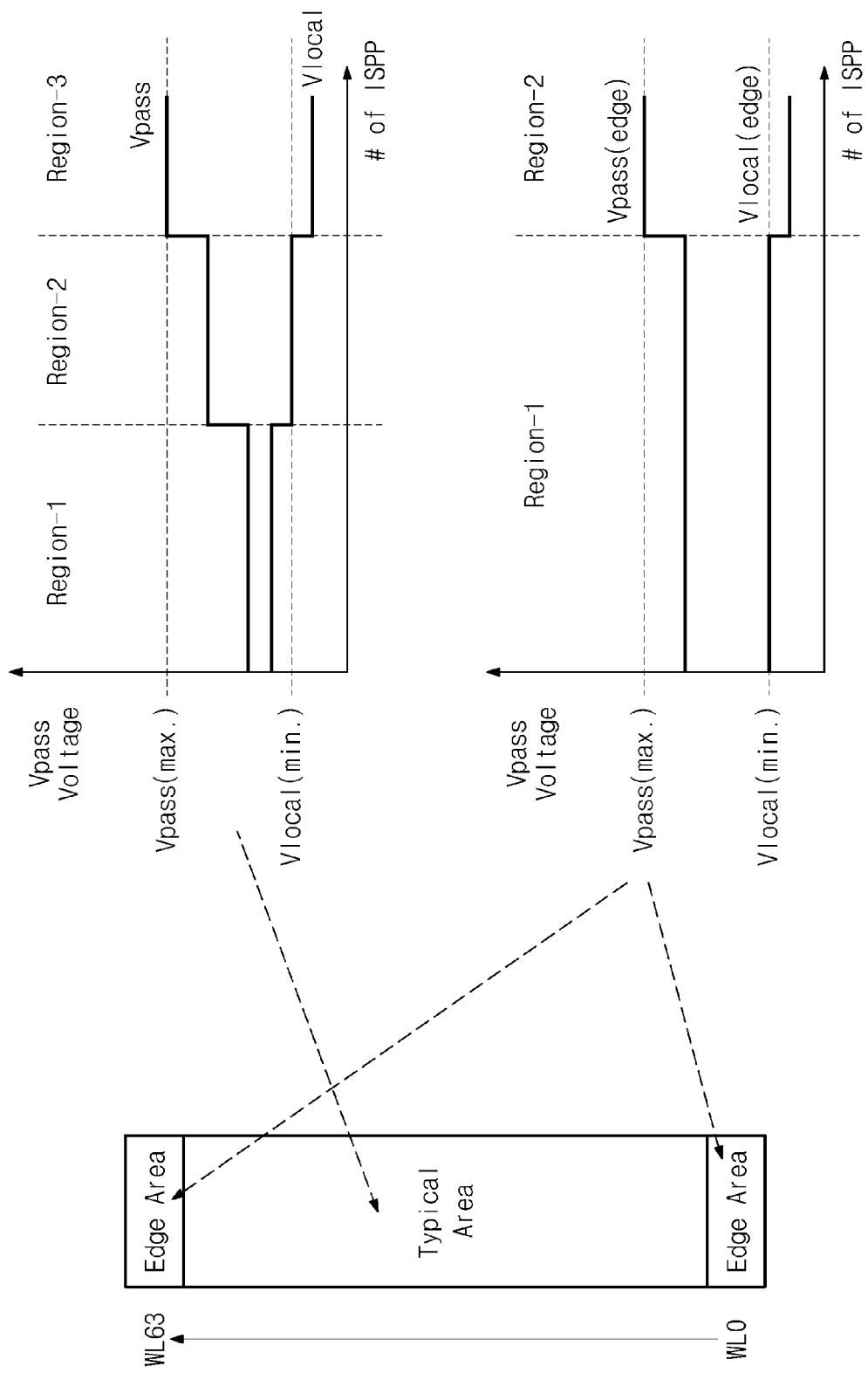
FIG. 24 is a block diagram illustrating modification of a pass voltage and a local voltage applied to the word lines of the memory cell array in FIG. 23.

FIG. 24 is a block diagram illustrating modification of a pass voltage and a local voltage which are applied according to the word lines of the memory cell array in FIG. 23.

Referring to FIG. 24, a first region Region-1 corresponds to the initiation of a program pulse based on the ISPP, a second region Region-2 corresponds to the middle of the program pulse based on the ISPP, and a third region Region-3 corresponds to the end of the program pulse based on the ISPP. In the first and third regions Region-1 and Region-3, a pass voltage and local voltage policy for the word lines at initial and final stages according to another embodiment of the invention applies a pass voltage Vpass less than the maximum of the pass voltage and applies a local voltage Vlocal equal to the minimum of the local voltage. In the second region Region-2, the pass voltage Vpass is equal to the maximum of the pass voltage is applied, and the local voltage Vlocal is less than the minimum of the local voltage is applied.

In the first region Region-1, a pass voltage and local voltage application policy for the word lines at a middle stage according to another embodiment of the invention applies the pass voltage Vpass less than the maximum of the pass voltage and applies the local voltage Vlocal greater than the minimum of the local voltage. In the second region Region-2, the pass voltage Vpass less than the maximum of the pass voltage is applied, and the local voltage Vlocal equal to the minimum of the local voltage is applied. In the third region Region-3, the pass voltage Vpass equal to the maximum of the pass voltage is applied, and the local voltage Vlocal less than the minimum of the local voltage is applied.

Referring to FIGS. 23 and 24, the pass voltage and local voltage application policy according to another embodiment of the invention applies the pass voltage Vpass and the local voltage Vlocal differently according to the word lines of the memory cell array, thereby leading to the improvement of the pass voltage window.

A memory device designed and operated in accordance with an embodiment of the invention may increase the pass voltage incrementally and decrease the local voltage incrementally in response to the program voltage which increases incrementally according to a defined ISPP during a program operation. Accordingly, the memory device provides improved pass voltage window performance.

Flash memory consistent with an embodiment of the invention may find ready application in numerous host devices and systems. Due to an increase in the demand for high performance mobile devices such as cellar phones, Personal Digital Assistant (PDA) digital cameras, portable game consoles and MP3Ps, flash memory is widely used for data and programming code storage. Flash memory is also used in various home applications such High Definition Televisions (HDTV), Digital Video Disks (DVD), routers and Global Positioning System (GPS).

Figure 25:
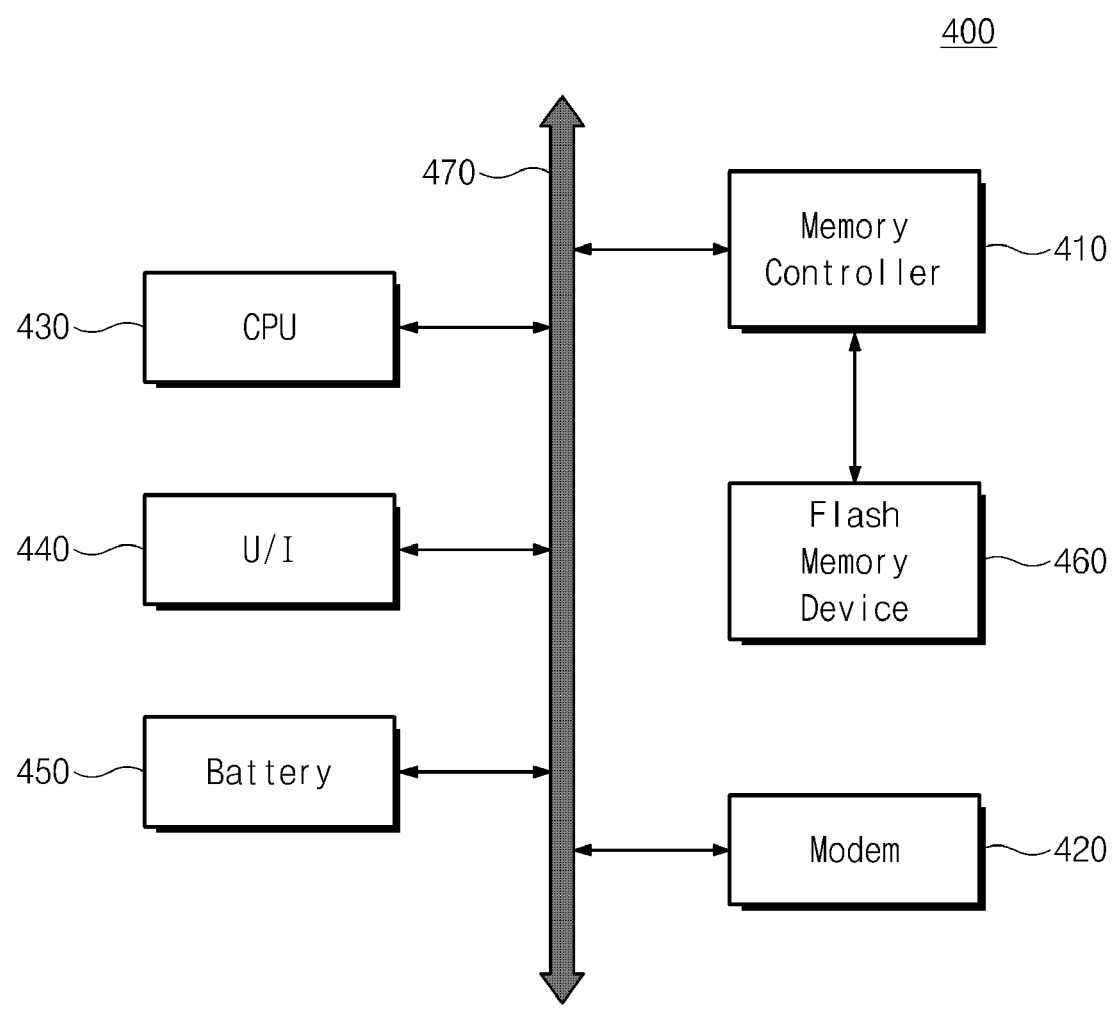
FIG. 25 is a block diagram illustrating a computational system including the memory system according to an embodiment of the present invention.

Against this commercial backdrop, a computational system including a memory system incorporating one or more flash memory devices according to an embodiment of the invention is schematically illustrated in FIG. 25. A computational system 400 includes a central processing unit (CPU) 430 electrically connected to a bus 470, a user interface 440, a modem 420 such as a baseband chipset, a memory controller 410, and a flash memory device 460. The memory controller 410 controls the flash memory device 460. N-bit data (where N is one or more integer), which have been processed or are to be processed by the CPU 430, are stored in the flash memory device 460 through the memory controller 410. If the computing system according to an exemplary embodiment of the invention is the mobile device, it may further include a battery 450 for supplying the operation voltage of the computing system. Although not shown, the computing system may further include an application chipset, a Camera Image Processor (CIS) and/or a mobile Dynamic Random Access Memory (DRAM). This is apparent to those skilled in the art. The memory controller 410 and the flash memory device 460, for example, may be implemented with a Solid State Drive/ Disk (SSD) which uses a nonvolatile memory in storing data. As an example, the SSD has been disclosed in U.S. Patent Publication No. 2006-0152981. The memory controller 410 and the flash memory device 460 may be implemented with a memory card which uses the nonvolatile memory in storing data.

Figure 26:
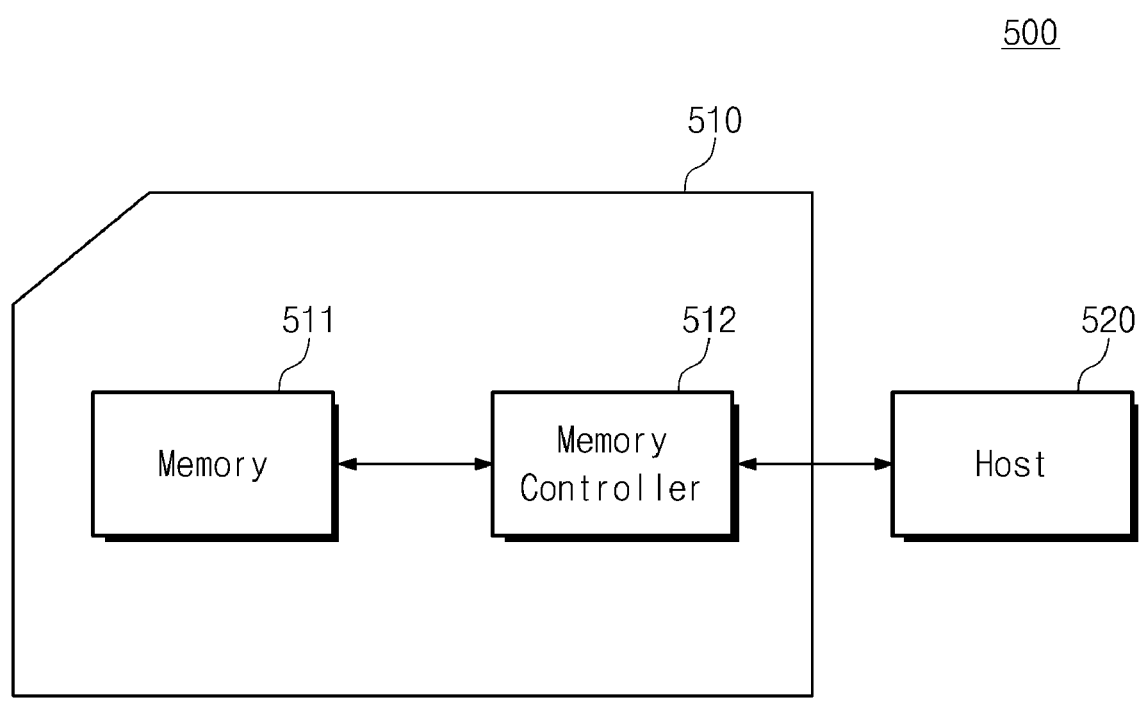
FIG. 26 is a block diagram illustrating a memory-based storage device according to another embodiment of the present invention.

FIG. 26 is a block diagram illustrating a memory-based storage device according to another exemplary embodiment of the invention.

Referring to FIG. 26, a memory-based storage device 500 according to another embodiment of the invention includes a card 510 which is configured with a memory 511 and a memory controller 512. For example, the card 510 may be a memory card such as a flash memory card. That is, the card 510 may be a card which satisfies any industrial standard for using electronic devices such as digital cameras and personal computers. Therefore, it can be understood that the memory controller 512 may control the memory 511 according to control signals which are received by the card 510 or from the host 520.

According to the foregoing exemplary embodiments of the invention, by expanding a pass voltage window, the reliability of a constituent memory device may be improved and programming error reduced.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory device, comprising:
a memory cell array comprising a plurality of memory cells arranged in relation to a plurality of word lines including a selected word line and a plurality of non-selected word lines, and a plurality of bit lines;
a high voltage generator configured to generate a program voltage applied to the selected word line, a pass voltage applied to at least one of the non-selected word lines adjacent to the selected word line, and a local voltage applied to at least one of the non-selected word lines in a local self-boosting scheme; and
control logic configured to control the generation of the program voltage, such that the program voltage is incrementally increased during a program operation, and further configured to control the generation of the pass voltage, such that the pass voltage is incrementally increased in response to the program voltage, and still further configured to control the generation of the local voltage to decrease the local voltage in response to the increasing program voltage.

2. The memory device of claim 1, wherein generation of the program voltage is controlled in relation to a defined Incremental Step Pulse Programming (ISPP).

3. The memory device of claim 1, wherein the memory cell array comprises at least one memory cell string,
wherein the program voltage is applied to one memory cell in the memory cell string,
a first pass voltage is applied to an upper word line with respect to the one memory cell, and
a second pass voltage is applied to a lower word line with respect to the one memory cell.

4. The memory device of claim 3, wherein the second pass voltage is greater than the first pass voltage, thereby preventing charge sharing between memory cells.

5. The memory device of claim 3, wherein the control logic is further configured to divide the upper word line and the lower word line into a plurality of groups, and selectively apply the pass voltage and the local voltage to the plurality of groups.

6. The memory device of claim 3, wherein the control logic is further configured to apply the pass voltage and the local voltage to respective memory cells in the memory cell string.

7. A program method for a memory device including a memory cell array comprising a plurality of memory cells arranged in relation to a plurality of word lines including a selected word line and a plurality of non-selected word lines, and a plurality of bit lines, a high voltage generator configured to generate a program voltage applied to the selected word line, a pass voltage applied to at least one of the non-selected word lines adjacent to the selected word line, and a local voltage applied during to at least one of the non-selected word lines in a local self-boosting scheme, and control logic configured to control operation of the memory cell array and the high voltage generator, wherein the program method comprises:
generating the program voltage to be incrementally increasing;
generating the pass voltage to be increasing in response to the increasing program voltage; and
generating the local voltage to be decreasing in response to the increasing program voltage.

8. The method of claim 7, wherein generation of the program voltage is controlled in relation to a defined Incremental Step Pulse Programming (ISPP).

9. The method of claim 7, wherein the pass voltage is incrementally increased in response to the program voltage.

10. The method of claim 7, wherein the memory cell array comprises at least one memory cell string and the method further comprises:
applying the program voltage to one memory cell in the memory cell string,
applying a first pass voltage to an upper word line with respect to the one memory cell, and
applying a second pass voltage to a lower word line with respect to the one memory cell.

11. The method of claim 10, wherein the second pass voltage is greater than the first pass voltage.

12. The method of claim 10, further comprising:
dividing the upper word line and the lower word line into a plurality of groups; and
selectively apply the pass voltage and the local voltage to the plurality of groups.

13. The method of claim 10, further comprising:
applying the pass voltage and the local voltage to respective memory cells in the memory cell string.

14. A computational system comprising a central processing unit (CPU) and a memory controller connected via a system bus, the memory controller being connected to and controlling the operation of a memory device,
wherein the memory device comprises:
a memory cell array comprising a plurality of memory cells arranged in relation to a plurality of word lines including a selected word line and a plurality of non-selected word lines, and a plurality of bit lines;
a high voltage generator configured to generate a program voltage applied to the selected word line, a pass voltage applied to at least one of the non-selected word lines adjacent to the selected word line, and a local voltage applied to at least one of the non-selected word lines in a local self-boosting scheme; and
control logic configured to control the generation of the program voltage, such that the program voltage is incrementally increased during a program operation, and further configured to control the generation of the pass voltage, such that the pass voltage is incrementally increased in response to the increasing program voltage, and still further configured to control the generation of the local voltage to decrease the local voltage in response to the program voltage.

15. The computational system of claim 14, wherein the memory cell array comprises at least one memory cell string, the program voltage is applied to one memory cell in the memory cell string, a first pass voltage is applied to an upper word line with respect to the one memory cell, and a second pass voltage greater than the first pass voltage is applied to a lower word line with respect to the one memory cell.

* * * * *